(12) United States Patent
Kawaguchi et al.

(10) Patent No.: US 11,454,652 B2
(45) Date of Patent: Sep. 27, 2022

(54) SENSOR AND SHUNT RESISTOR

(71) Applicant: YAZAKI CORPORATION, Tokyo (JP)

(72) Inventors: Yasunori Kawaguchi, Shizuoka (JP); Takanori Toma, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 208 days.

(21) Appl. No.: 16/879,870

(22) Filed: May 21, 2020

(65) Prior Publication Data
US 2020/0379014 A1 Dec. 3, 2020

(30) Foreign Application Priority Data

May 27, 2019 (JP) .............................. JP2019-098630

(51) Int. Cl.
| | |
|---|---|
| *G01R 1/20* | (2006.01) |
| *G01R 19/00* | (2006.01) |
| *G01R 31/364* | (2019.01) |
| *H01C 17/28* | (2006.01) |
| *G01R 15/00* | (2006.01) |
| *H01C 1/148* | (2006.01) |
| *H01R 11/28* | (2006.01) |

(52) U.S. Cl.
CPC ............ *G01R 1/203* (2013.01); *G01R 15/00* (2013.01); *G01R 19/0092* (2013.01); *G01R 31/364* (2019.01); *H01C 1/148* (2013.01); *H01C 17/28* (2013.01); *H01R 11/281* (2013.01)

(58) Field of Classification Search
None
See application file for complete search history.

(56) References Cited

U.S. PATENT DOCUMENTS

| | | | |
|---|---|---|---|
| 2013/0187575 A1* | 7/2013 | Yugou | H02P 23/14 318/139 |
| 2015/0108965 A1* | 4/2015 | Sato | G01R 1/203 324/120 |
| 2018/0174721 A1 | 6/2018 | Kameko et al. | |
| 2021/0293854 A1* | 9/2021 | Endo | G01R 19/32 |

FOREIGN PATENT DOCUMENTS

| | | |
|---|---|---|
| JP | 04-083175 A | 3/1992 |
| JP | 2004-221160 A | 8/2004 |
| JP | 2017-005204 A | 1/2017 |

* cited by examiner

*Primary Examiner* — Jas A Sanghera
(74) *Attorney, Agent, or Firm* — Sughrue Mion, PLLC

(57) ABSTRACT

Provided is a sensor including a first bus bar, a second bus bar, and a shunt resistor including a shunt resistor body part whose one end portion is bonded to the first bus bar and the other end portion is bonded to the second bus bar and a detection terminal extending from the shunt resistor body part.

8 Claims, 17 Drawing Sheets

FIG. 11B
FIG. 11A
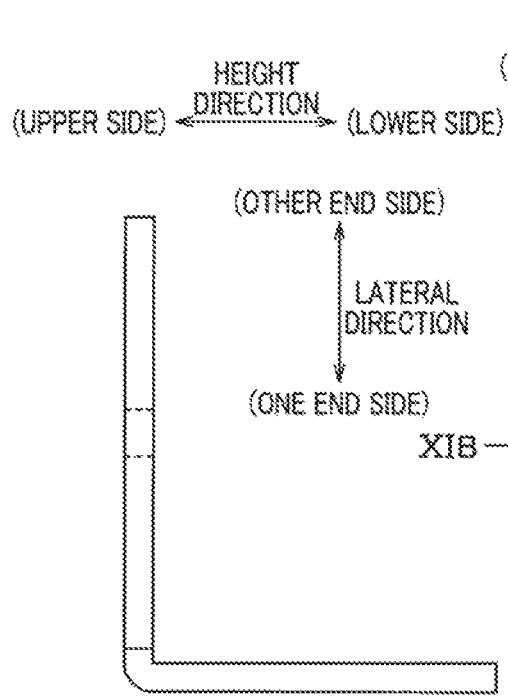
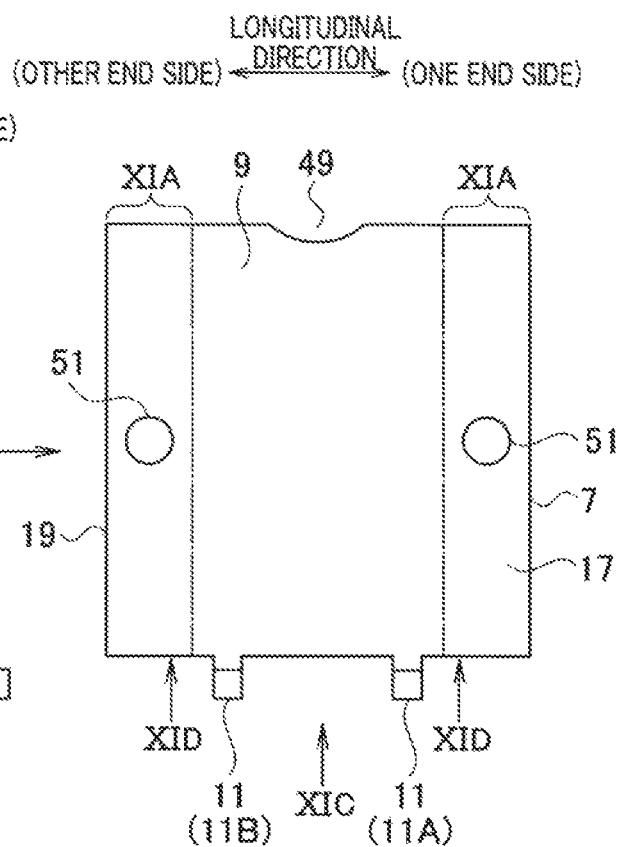
FIG. 11D
FIG. 11C
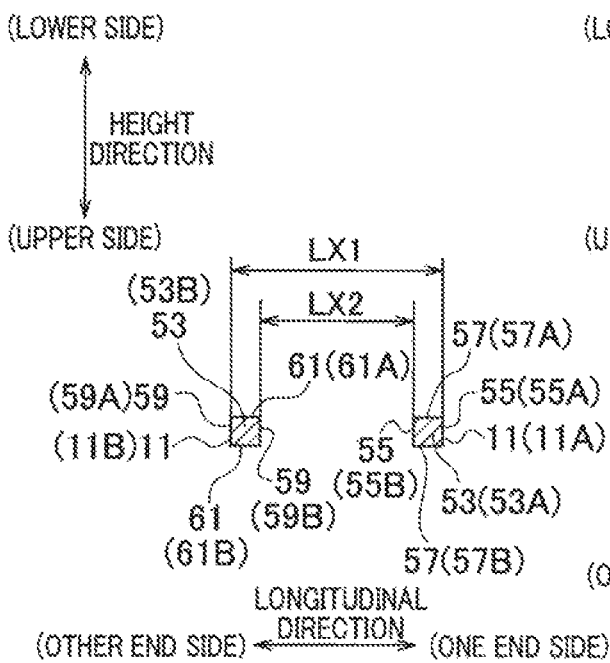
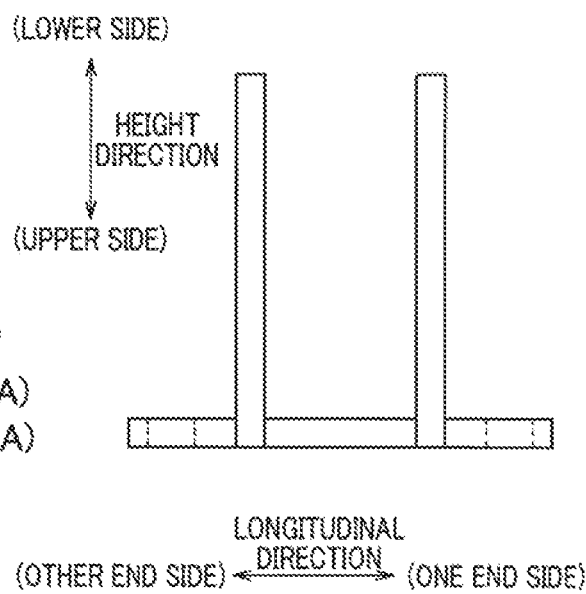

FIG. 14A                                          FIG. 14B

SENSOR AND SHUNT RESISTOR

CROSS-REFERENCE TO RELATED APPLICATIONS

The present application is based on, and claims priority from Japanese Patent Application No. 2019-098630, filed on May 27, 2019, the entire contents of which are incorporated herein by reference.

TECHNICAL FIELD

The present application relates to a sensor and a shunt resistor, and more particularly, to a sensor and a shunt resistor for detecting a current or a voltage.

BACKGROUND

JP 2017-5204 A discloses a shunt resistor device. The shunt resistor device includes a pair of bus bars and a shunt resistor sandwiched between the bus bars. A voltage between a pair of detection terminals when a current flows from the bus bar to the bus bar through the shunt resistor, or a current flowing from the bus bar to the bus bar through the shunt resistor is detected using a pair of detection terminals.

SUMMARY

However, the configuration of the shunt resistor device is complicated because the detection terminal is separately provided on the bus bar. In addition, when the fixing position of the detection terminal on the bus bar is shifted, the accuracy of the detected current value or voltage value is reduced.

An object of the present application is to provide a sensor and a shunt resistor which is simple in configuration and can accurately detect a current or a voltage.

The sensor according to the present application includes a first bus bar, a second bus bar, and a shunt resistor that includes a shunt resistor body part whose one end portion is bonded to the first bus bar and the other end portion is bonded to the second bus bar and a detection terminal extending from the shunt resistor body part.

According to the present application, it is possible to provide a sensor and a shunt resistor that is simple in configuration and can accurately detect the current and voltage.

BRIEF DESCRIPTION OF THE DRAWINGS

FIGS. 11A to 11D are views illustrating a shunt resistor of the sensor according to the embodiment of the present application, FIG. 11B is a view along arrow XIB in FIG. 11A, FIG. 11C is a view along arrow XIC in FIG. 11A, and FIG. 11D is a cross-sectional view taken along XID-XID in FIG. 11A;

FIGS. 14A to 14D are views illustrating a shunt resistor (before bending processing) according to the modified example, FIG. 14B is a view along arrow XIVB in FIG. 14A, FIG. 14C is a view along arrow XIVC in FIG. 14A, and FIG. 14D is a cross-sectional view taken along XIVD-XIVD in FIG. 14A;

FIG. 17A is a view corresponding to FIG. 12A, FIG. 17B is a view corresponding to FIG. 12B, and FIG. 17C is a view corresponding to FIG. 16.

DETAILED DESCRIPTION

Various embodiments will be described hereinafter with reference to the accompanying drawings.

Figure 1:
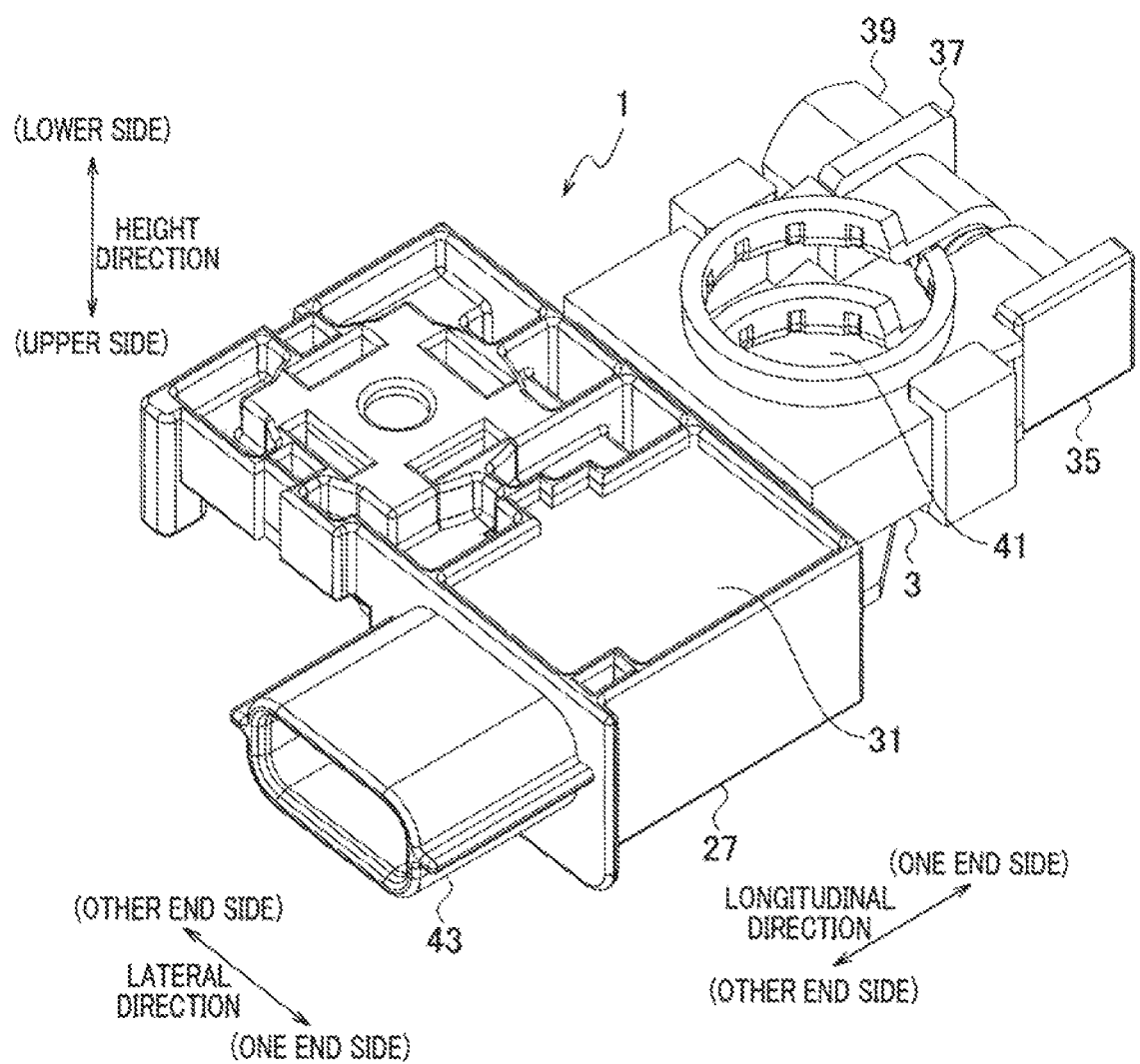
FIG. 1 is a perspective view of a sensor according to an embodiment of the present application.
Figure 2:
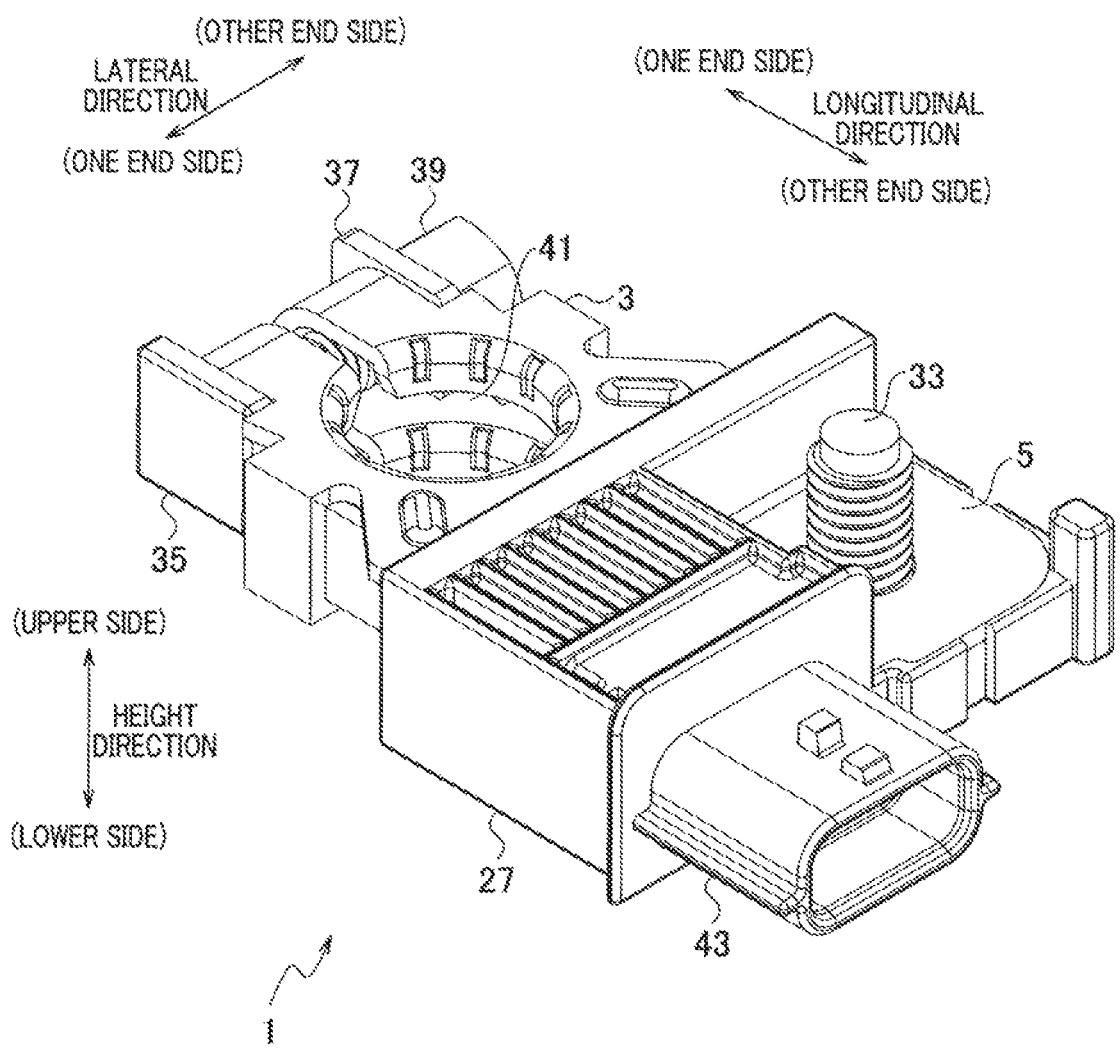
FIG. 2 is a perspective view of the sensor according to the embodiment of the present application as seen from a direction different from FIG. 1.
Figure 3:
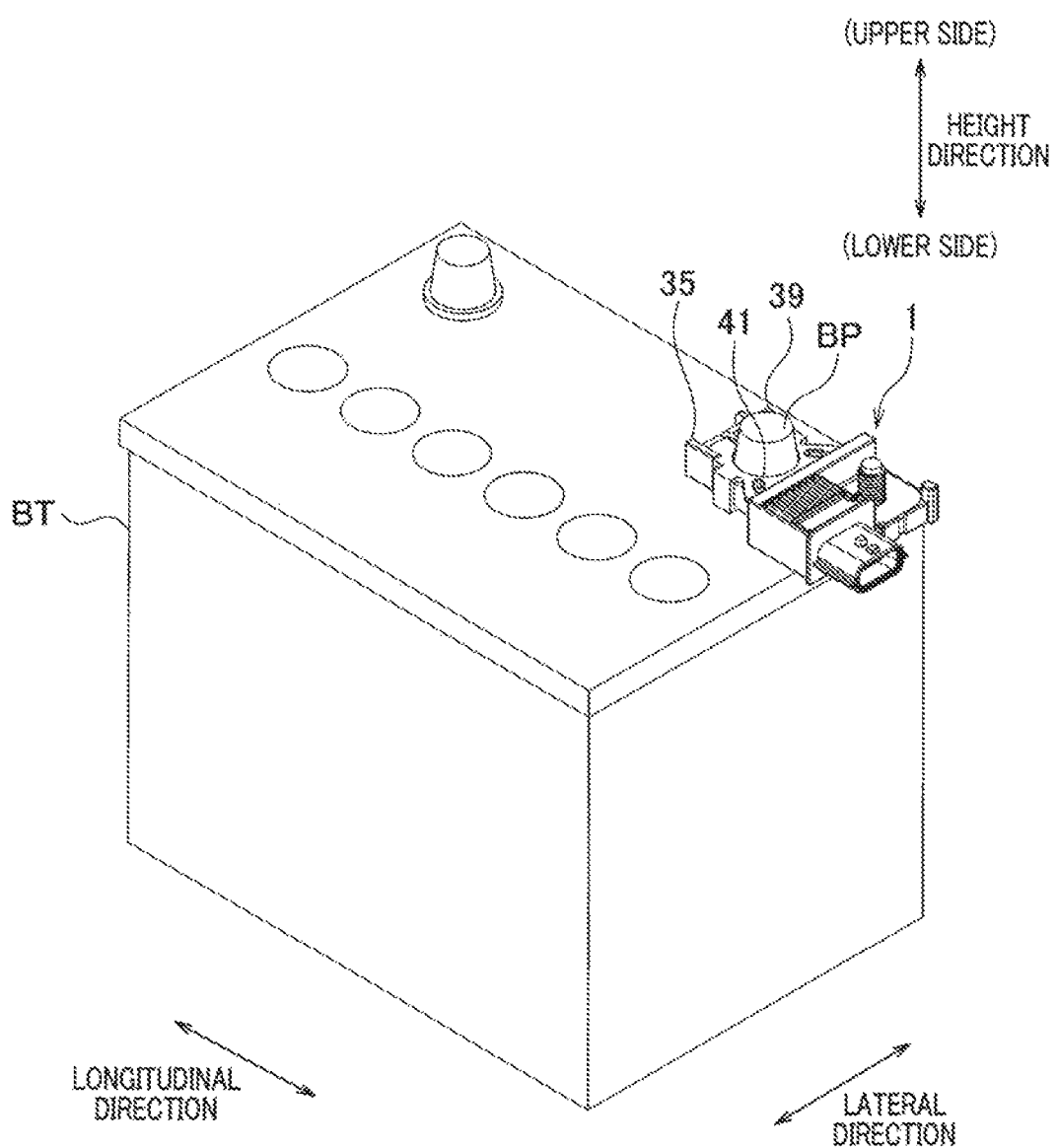
FIG. 3 is a view illustrating a state in which the sensor according to the embodiment of the present application is fixed in a battery.
Figure 4:
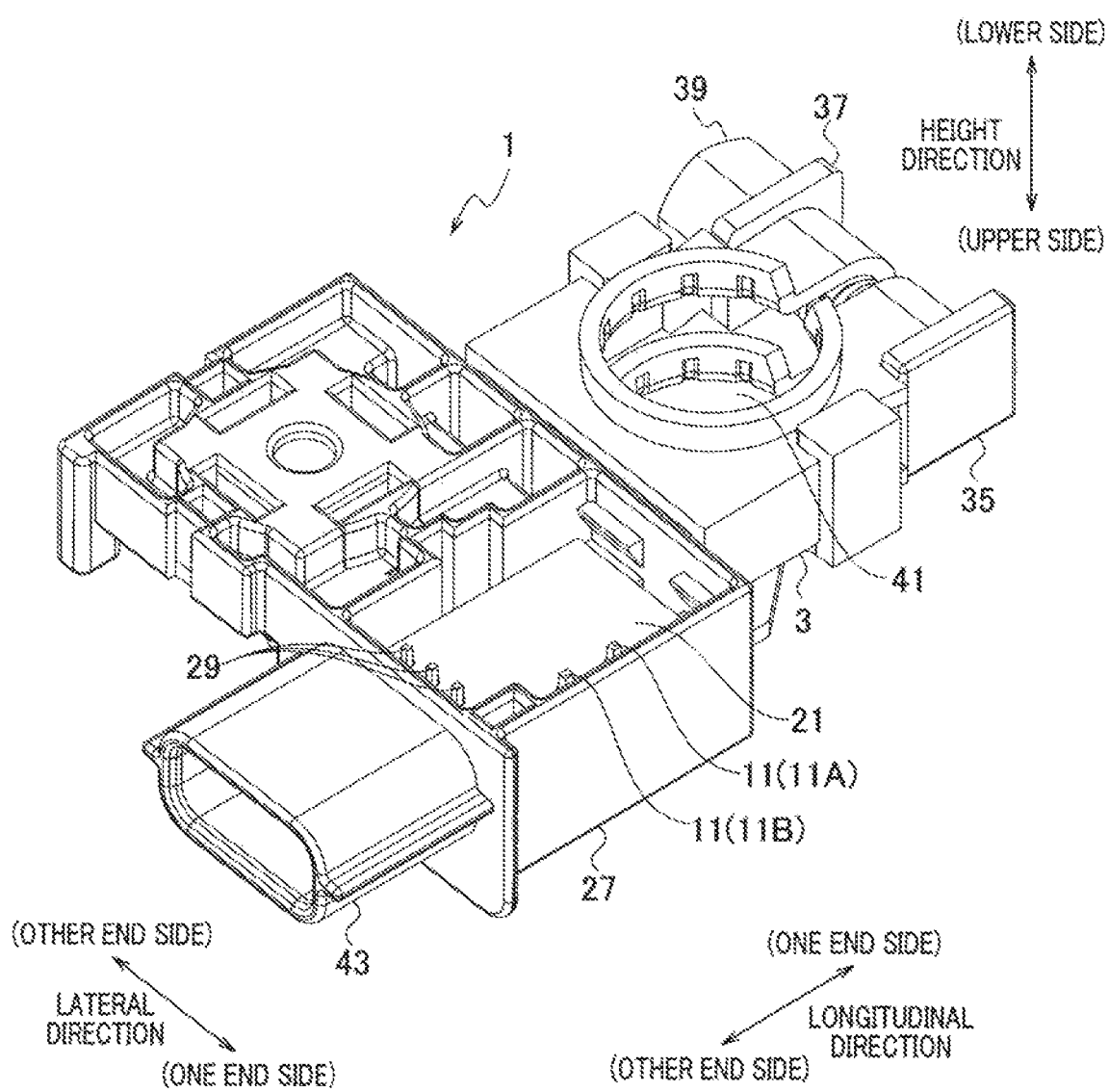
FIG. 4 is a view illustrating a state in which a sealing material is removed from the sensor illustrated in FIG. 1.
Figure 5:
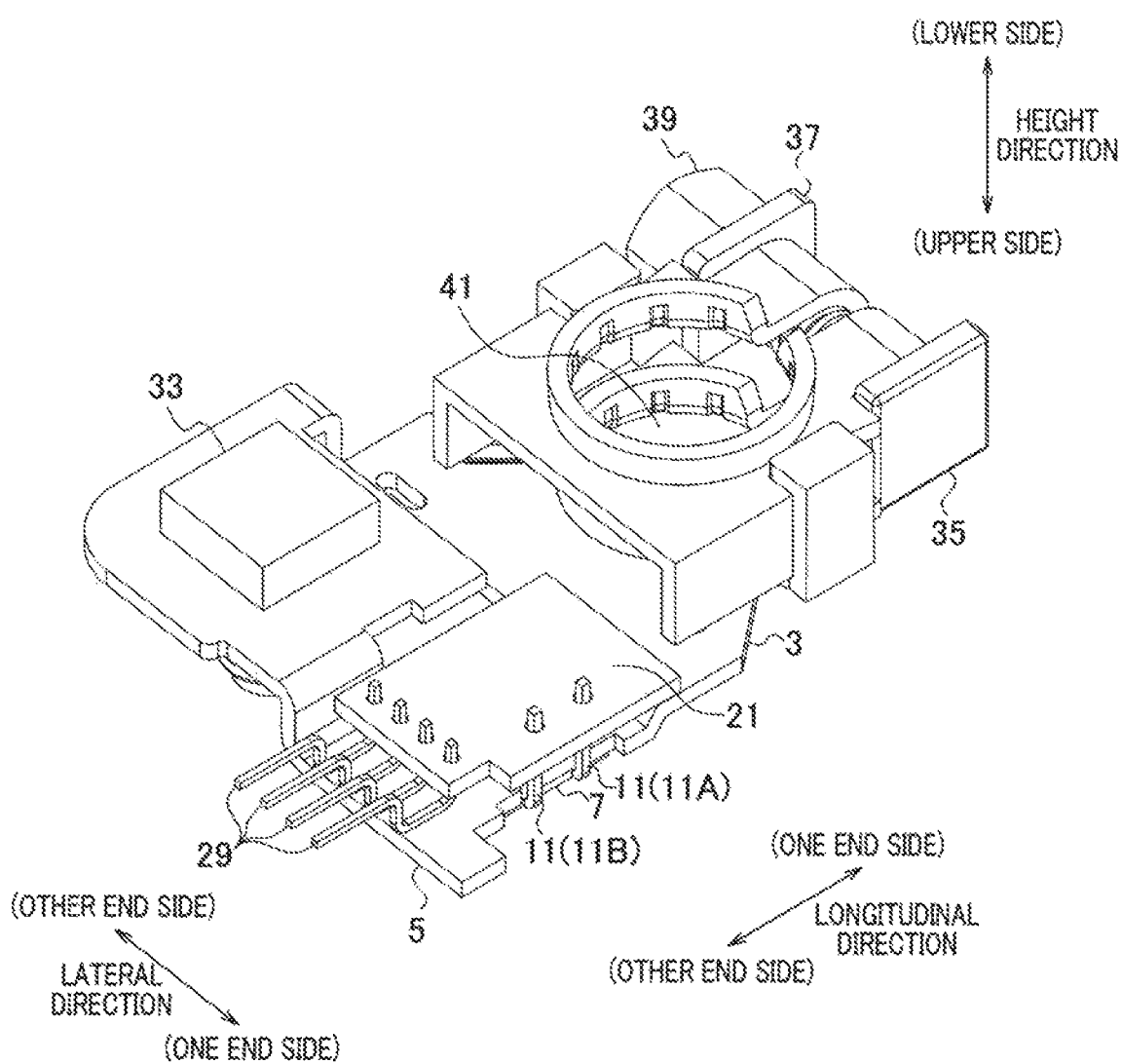
FIG. 5 is a view illustrating a state in which the sealing material and the housing are removed from the sensor illustrated in FIG. 1.
Figure 6:
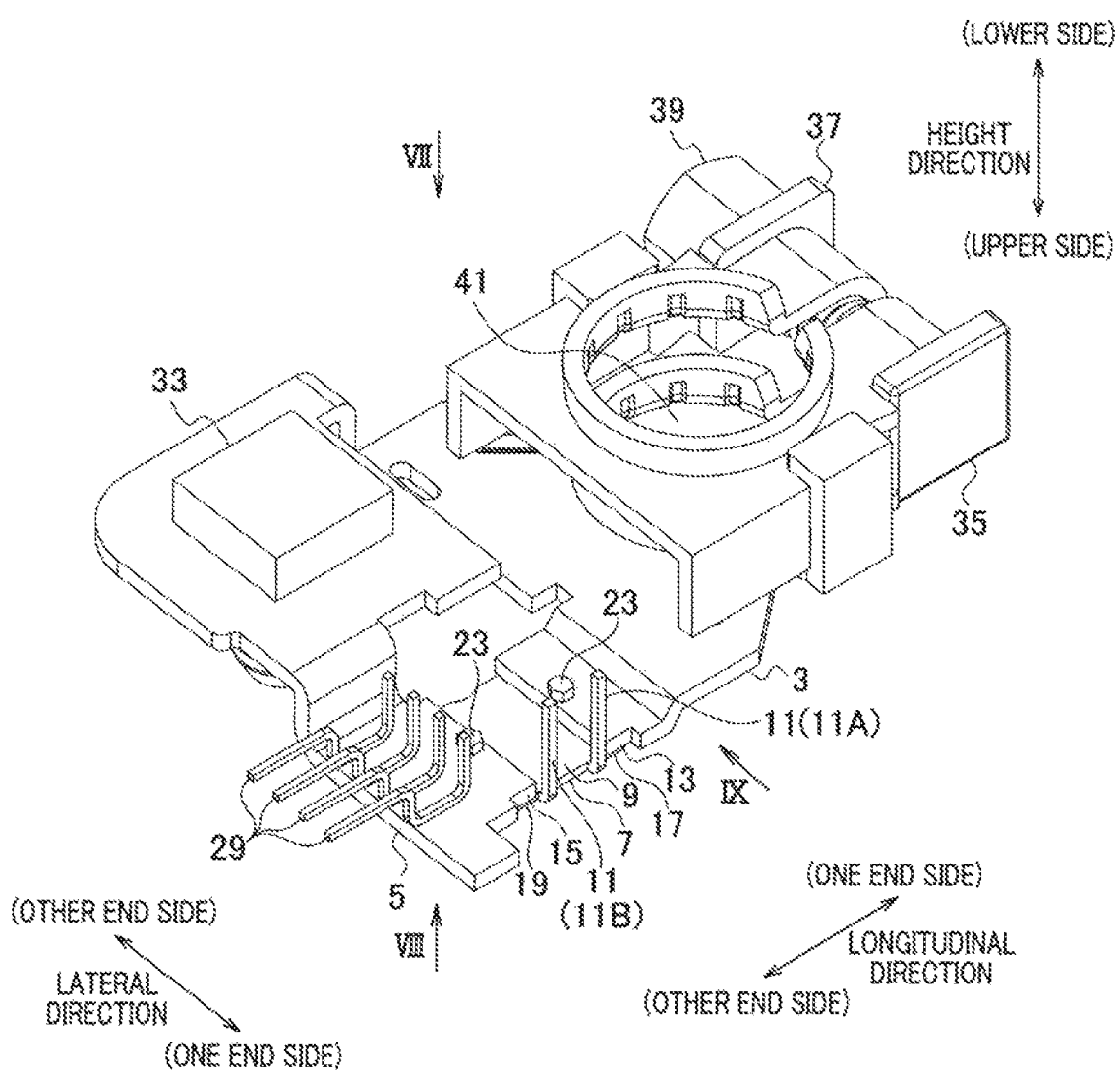
FIG. 6 is a view illustrating a state in which the sealing material, the housing, and a circuit board are removed from the sensor illustrated in FIG. 1.
Figure 7:
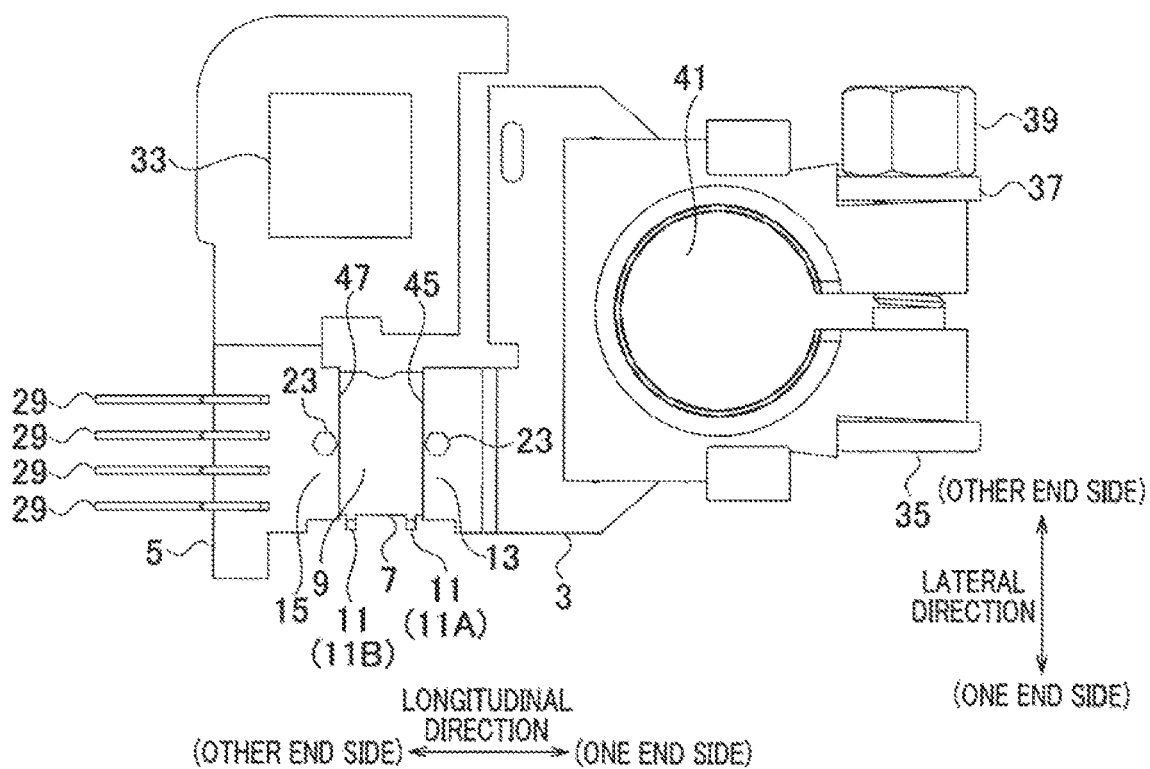
FIG. 7 is a view along arrow VII in FIG. 6.
Figure 8:
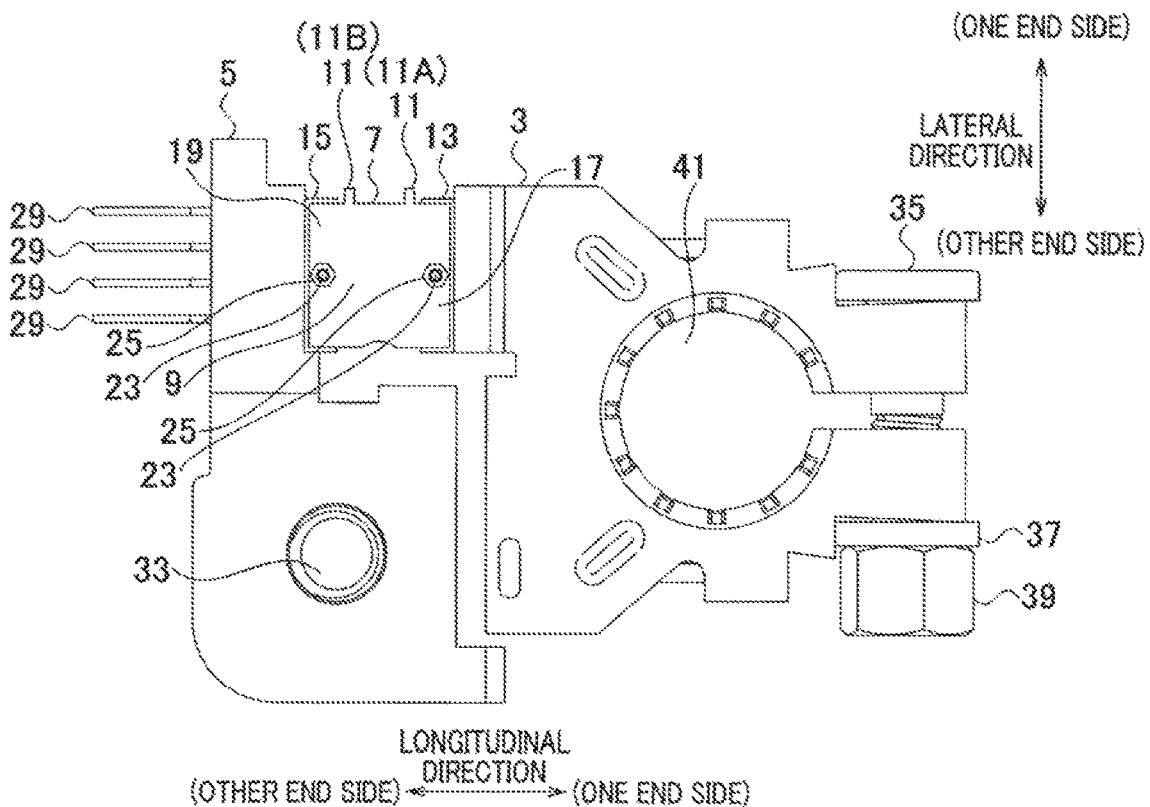
FIG. 8 is a view along arrow VIII in FIG. 6.
Figure 9:
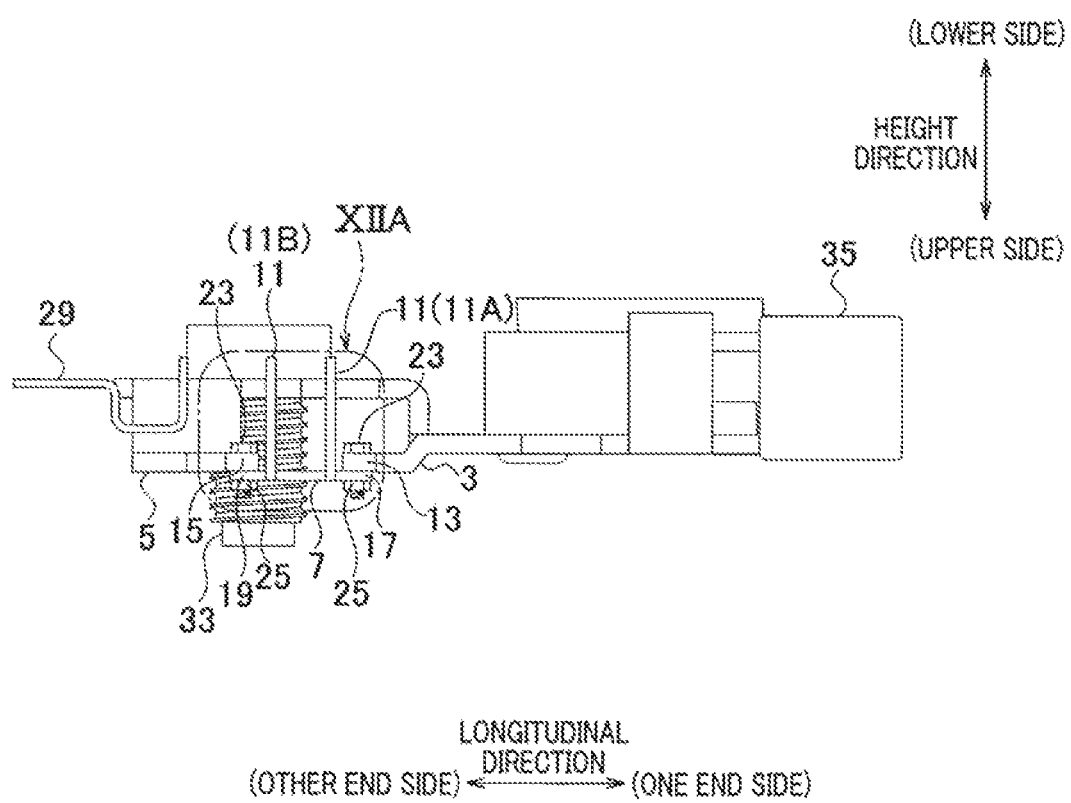
FIG. 9 is a view along arrow IX in FIG. 6.
Figure 10:
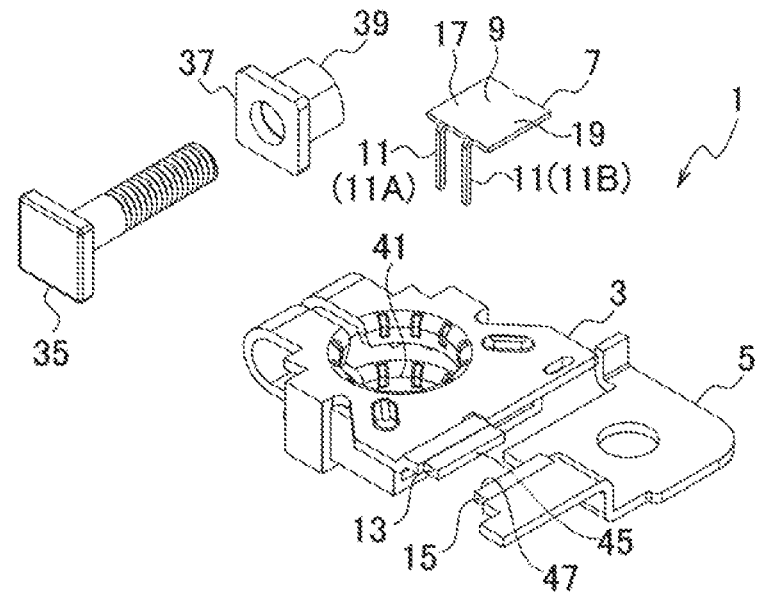
FIG. 10 is an exploded perspective view of the sensor according to the embodiment of the present application.
Figure 10:
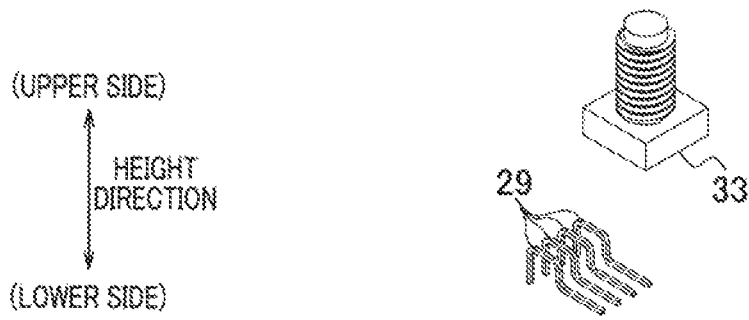
Figure 10:
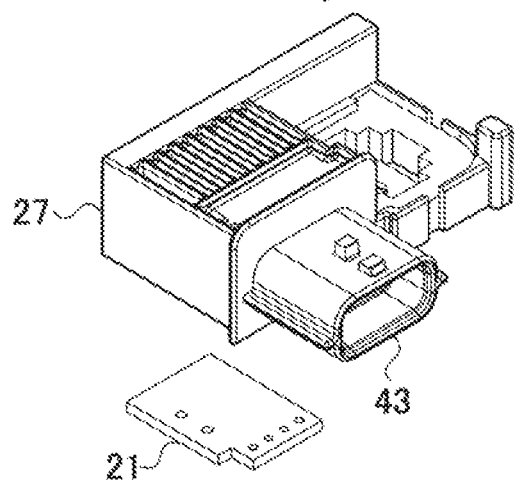
Figure 10:
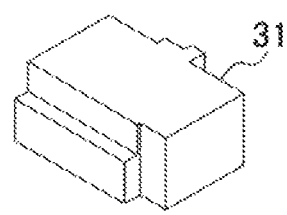

A sensor 1 according to an embodiment of the present application is used, for example, by being fixed on a battery post BP of a car battery BT as illustrated in FIG. 3, and is configured to include a first bus bar 3, a second bus bar 5, and a shunt resistor 7 as illustrated in FIGS. 5 to 10. For convenience of description, a predetermined direction is defined as a longitudinal direction, a predetermined direction orthogonal to the longitudinal direction is defined as a lateral direction, and a direction orthogonal to the longitudinal direction and the lateral direction is defined as a height direction.

The first bus bar 3 is made of a conductive material such as copper, the second bus bar 5 is made of the same conductive material such as copper as the first bus bar 3, and is separately configured from the first bus bar 3. That is, the second bus bar 5 is not directly connected to the first bus bar 3 but is separated from the first bus bar 3. That is, if the shunt resistor 7 is not fixed on the first bus bar and the second bus bar, the first bus bar and the second bus bar are in a non-conductive state.

The shunt resistor 7 is configured to include a shunt resistor body part 9 and a pair of detection terminals 11 (11A and 11B).

The shunt resistor body part 9 has one longitudinal end portion directly bonded to the first bus bar 3 and the other longitudinal end portion directly bonded to the second bus bar 5. Thereby, the first bus bar 3, the shunt resistor body part 9, and the second bus bar 5 are electrically conducted to each other. The pair of detection terminals 11 (11A and 11B) extends from the shunt resistor body part 9. Note that a plurality of pairs of detection terminals 11 may be provided. For example, in FIG. 12A, the pair of detection terminals 11 may be provided not only at one end in the lateral direction but also at the other end in the lateral direction.

The sensor 1 is a current sensor that detects (measures; senses) a current flowing from the first bus bar 3 to the second bus bar 5 or a current flowing from the second bus bar 5 to the first bus bar 3. Note that the sensor 1 may be a voltage sensor that detects (measures; senses) a voltage between the first bus bar 3 and the second bus bar 5.

As already understood, the first bus bar 3 is provided with a first shunt resistor fixing part 13 which one end portion of the shunt resistor body part 9 in the longitudinal direction contacts when the shunt resistor 7 is fixed. The second bus bar 5 is also provided with a second shunt resistor fixing part 15 which the other end portion of the shunt resistor body part 9 in the longitudinal direction contacts when the shunt resistor 7 is fixed.

When the shunt resistor 7 is fixed on the first bus bar 3, one end portion of the shunt resistor body part 9 in the longitudinal direction is provided with a first bus bar contact part 17 that contacts the first shunt resistor fixing part 13. When the shunt resistor 7 is fixed on the second bus bar 5, the other end portion of the shunt resistor body part 9 in the longitudinal direction is provided with a second bus bar contact part 19 that contacts the second shunt resistor fixing part 15.

The shunt resistor 7 is made of a material (for example, Cu—Mn—Ni alloy) having better temperature characteristics than those of each bus bars 3 and 5. That is, the shunt resistor 7 is made of a material in which a change in a resistance value due to a change in temperature is extremely small as compared with the bus bars 3 and 5. Instead of the Cu—Mn—Ni alloy, the material constituting the shunt resistor 7 can be a Cu—Ni alloy, a Ni—Cr alloy, or the like.

The pair of detection terminals 11 (11A and 11B) is separated from each other to have a predetermined dimension to be described later, in a direction (longitudinal direction) in which one end portion and the other end portion of the shunt resistor body part 9 are connected to each other. Further, the first shunt resistor fixing part 13 of the first bus bar 3 and the second shunt resistor fixing part 15 of the second bus bar 5 are separated from each other in the longitudinal direction.

The sensor 1 detects a current value flowing between the first bus bar 3 and the second bus bar 5 by detecting a voltage between the pair of detection terminals 11 (11A and 11B).

More specifically, the sensor 1 is provided with a circuit board (wiring board assembly) 21. The pair of detection terminals 11 (11A and 11B) is directly bonded to a detection terminal bonded part of the circuit of the circuit board 21 (directly bonded so as to be conducted to the detection terminal bonded portion).

With such a structure, when a current flows from the first bus bar 3 to the second bus bar 5, a potential difference occurring between the pair of detection terminals 11 (11A and 11B) is input to the circuit of the circuit board 21, and a current value flowing from the first bus bar 3 to the second bus bar 5 is determined.

The shunt resistor 7 is bonded to each of the bus bars 3 and 5 using a bolt 23 and a nut 25.

Instead of using the bolt 23 and the nut 25, the shunt resistor 7 may be bonded to each of the bus bars 3 and 5 using a fixing tool (bonding part) such as a rivet (including a resin rivet), or the shunt resistor 7 may be bonded to each of the bus bars 3 and 5 by welding (laser welding or electronic beam welding). Furthermore, if there is no short circuit between the terminals 11, the shunt resistor 7 may be bonded to each of the bus bars 3 and 5 with brazing or an adhesive having conductivity.

As illustrated in FIGS. 1, 2, 4, and 10, and the like, the sensor 1 is configured to include a housing 27, a terminal 29, a sealing material (mold material) 31, a bolt (bolt different from the bolt 23) 33, a bolt (for example, square bolt different from the bolts 23 and 33) 35, a washer 37, and a nut (nut different from the nut 25) 39. In the sensor 1 illustrated in FIG. 10, the shunt resistor 7 is bonded to each of the bus bars 3 and 5 by welding, so the bolt 23 and the nut 25 are not illustrated.

The housing 27 or the sealing material 31 are made of an insulating synthetic resin, and the terminals 29, the bolts 23, 33, and 35, the washers 37, or the nuts 25 and 39 are made of conductive metals.

One end portion of the first bus bar 3 in the longitudinal direction is not covered with the housing 27 and is exposed. A hole 41 is formed in the exposed portion. The bolt 35, the washer 37, and the nut 39 are engaged with the first bus bar 3 near the hole 41. The hole 41 is configured so that an inner diameter thereof is reduced by tightening the bolt 35 and the nut 39.

As illustrated in FIG. 3, when the bolt 35 and the nut 39 are tightened in a state in which the terminal (battery post) BP of the battery BT is inserted into the hole 41, the sensor 1 is integrally fixed with the battery BT.

The terminal 29 has one end portion bonded to a bonded portion of the terminals of the circuit board 21. The other end portion of the terminal 29 is exposed in a hood part 43 of the housing 27. Power is supplied to the sensor 1 by the terminal 29, and furthermore, an output is made corresponding to the current value detected by the sensor 1.

A portion of the second bus bar 5 and a male screw portion of the bolt 33 are exposed at the other end portion in the longitudinal direction of the housing 27. A device that operates with power supplied from the battery BT via the first bus bar 3, the shunt resistor 7, and the second bus bar 5 is connected to a portion of the second bus bar 5 and the male screw portion of the bolt 33.

The housing 27 and the sealing material 31 cover the shunt resistor 7, the circuit board 21, the first shunt resistor fixing part 13 of the first bus bar 3, and the second shunt resistor fixing part 15 of the second bus bar 5.

The first bus bar 3 or the second bus bar 5 will be described in more detail. The first shunt resistor fixing part 13 of the first bus bar 3 is formed in a rectangular flat plate shape, and the second shunt resistor fixing part 15 of the second bus bar 5 is also formed in a rectangular flat plate shape. Further, a thickness direction of the first shunt resistor fixing part 13 and a thickness direction of the second shunt resistor fixing part 15 coincide with a height direction.

One side surface (one side surface facing the second shunt resistor fixing part 15) 45 of the first shunt resistor fixing part 13 is formed in a rectangular shape orthogonal to the longitudinal direction, and similarly, one side surface (one side surface facing the first shunt resistor fixing part 13) 47 of the second shunt resistor fixing part 15 is also formed in a rectangular shape orthogonal to the longitudinal direction.

When viewed in the longitudinal direction, the entire first shunt resistor fixing part 13 (side surface 45) and the entire second shunt resistor fixing part 15 (side surface 47) overlap each other.

Next, the shunt resistor 7 will be described in detail with reference to FIGS. 11A to 11D.

The shunt resistor body part 9 is formed in a plate shape (for example, a rectangular flat plate shape). A first detection terminal 11A extends from the shunt resistor body part 9. When the shunt resistor body part 9 is viewed in the thickness direction (height direction), the first detection terminal 11A slightly protrudes in the lateral direction from the edge of the shunt resistor body part 9.

A second detection terminal 11B is away from the first detection terminal 11A and, like the first detection terminal 11A, extends from the shunt resistor body part 9. When the shunt resistor body part 9 is viewed in the thickness direction (height direction), the second detection terminal 11B slightly protrudes in the lateral direction from the edge of the shunt resistor body part 9.

More specifically, the first detection terminal 11A protrudes thin and long from the edge (middle portion of one side on one end side in the lateral direction) of the shunt resistor body part to one side (lower side in the height direction) of the shunt resistor body part 9 in the thickness direction. The second detection terminal 11B also protrudes thin and long from the edge (middle portion of one side on one end side in the lateral direction) of the shunt resistor body part to one side (lower side in the height direction) of the shunt resistor body part 9 in the thickness direction.

Each detection terminal 11 (11A and 11B) is stretched straight from the shunt resistor body part 9 in the height direction, but each detection terminal 11 (11A and 11B) may be stretched obliquely to the height direction and may be bent and stretched.

The shunt resistor body part 9 and each of the detection terminals 11 (11A and 11B) are made of the same member (the same material).

More specifically, the shunt resistor 7 is formed in a shape in which, with respect to a shunt resistor semi-finished product that is a flat plate material having a predetermined thickness and formed in a predetermined shape, each detection terminal 11 (11A and 11B) is bent with respect to the shunt resistor body part 9.

When the shunt resistor 7 is viewed in the height direction, the shunt resistor body part 9 is formed in a rectangular shape in which the longitudinal direction has a predetermined dimension and the lateral direction has a predetermined dimension.

One detection terminal 11A of the pair of detection terminals 11 (11A and 11B) is formed in an elongated quadrangular prism shape having a rectangular (for example, square) bottom surface. A value of the length of one side of the square on the bottom surface of one detection terminal 11A having the quadrangular prism shape is, for example, 0.8 mm, which matches the value of the thickness dimension of the shunt resistor body part 9.

One detection terminal 11A is a middle portion of one side (one side on one end side in the lateral direction) of the rectangular shunt resistor body part 9 and is arranged at a position slightly biased to one side in the longitudinal direction.

The one detection terminal 11A having the quadrangular prism shape extends to one side (lower side) of the shunt resistor body part 9 in the thickness direction. Note that one side of the square bottom surface of the detection terminal 11A is in contact with the one side of the shunt resistor body part 9.

The other detection terminal 11B of the pair of detection terminals is formed in the same shape as the one detection terminal 11A.

The other detection terminal 11B is a middle portion of one side (the same side as the side where one detection terminal 11A is arranged) of the rectangular shunt resistor body part 9, and is arranged at a position slightly biased to the other side in the longitudinal direction.

The other detection terminal 11B having the quadrangular prism shape has the same shape as the one detection terminal 11A, and extends to one side (lower side) of the shunt resistor body part 9 in the thickness direction. Note that one side of the square bottom surface of the detection terminal 11B is also in contact with the one side of the shunt resistor body part 9.

The shunt resistor body part 9 has a cutout 49 formed by trimming for electric resistance value adjustment, and is provided with a pair of through holes 51 (through hole that penetrates through the shunt resistor body part 9 in this thickness direction) used when the shunt resistor 7 is fixed to each bus bars 3 and 5 using the bolt 23 or the nut 25. Note that the first shunt resistor fixing part 13 or the second shunt resistor fixing part 15 is also provided with through holes similar to the through holes 51.

When viewed in the height direction, the cutout 49 is formed in an arc shape, and is arranged at the center of one side on the other side of the shunt resistor body part 9 in the lateral direction. Note that if a cross-sectional area (cross-sectional area by a plane orthogonal to the longitudinal direction) of the shunt resistor body part 9 between the terminals 11 is reduced, the position of the trimmed cutout 49 may be moved to another position, and the shape of the trimmed cutout 49 may be another shape.

When viewed in the height direction, the pair of through holes 51 is formed in a circular shape. One of the pair of through holes 51 is arranged at the center of the shunt resistor body part 9 in the lateral direction, and is arranged at a position biased to one side from one detection terminal 11A of the shunt resistor body part 9 in the longitudinal direction.

When viewed in the height direction, the other of the pair of through holes 51 is arranged at the center of the shunt resistor body part 9 in the lateral direction, and is arranged at the position biased to the other side from the other detection terminal 11B of the shunt resistor body part 9 in the longitudinal direction.

More specifically, when viewed in the height direction, the pair of through holes 51 is arranged outside the pair of detection terminals 11 (11A and 11B). When viewed in the height direction, the cutout 49 is formed, for example, inside the pair of detection terminals 11 (11A and 11B). Thereby, the voltage between the pair of detection terminals 11 (11A and 11B) can be accurately detected.

The shunt resistor 7 is formed symmetrically with respect to a neutral plane. The neutral plane is a plane that includes the center of the rectangular shunt resistor body part 9 and is orthogonal to the longitudinal direction. The first shunt resistor fixing part 13 of the first bus bar 3 or the second shunt resistor fixing part 15 of the second bus bar 5 are also formed and arranged symmetrically with respect to the neutral plane.

The first bus bar contact part 17 is formed on one end portion side of the shunt resistor body part 9 in the longitudinal direction, and the second bus bar contact part 19 is formed on the other end portion side of the shunt resistor body part 9 in the longitudinal direction. That is, each of the bus bar contact parts 17 and 19 is formed at a location indicated by reference numeral XIA in FIG. 11A.

In the state in which the shunt resistor 7 (shunt resistor body part 9) is fixed on the first bus bar 3 (first shunt resistor fixing part 13) and the second bus bar 5 (second shunt resistor fixing part 15), the lower surface of the first bus bar contact part 17 of the shunt resistor body part 9 and the upper surface of the first shunt resistor fixing part 13 of the first bus bar 3 are in surface contact with each other, and the lower surface of the second bus bar contact part 19 of the shunt resistor body part 9 and the upper surface of the second shunt resistor fixing part 15 of the second bus bar 5 are in surface contact with each other.

An area of the contact surface between the first bus bar contact part 17 and the first shunt resistor fixing part 13 and an area of the contact surface between the second bus bar contact part 19 and the second shunt resistor fixing part 15 are substantially equal to each other. Note that if there is no mounting error or the like of the shunt resistor 7 to the first bus bar 3 and the second bus bar 5, an area of the contact surface between the first bus bar contact part 17 and the first shunt resistor fixing part 13 and an area of the contact surface between the second bus bar contact part 19 and the second shunt resistor fixing part 15 is equal to each other.

An area (area of the contact surface between the second bus bar contact part 19 and the second shunt resistor fixing part 15) of the contact surface between the first bus bar contact part 17 and the first shunt resistor fixing part 13 is larger than the cross-sectional area (cross-sectional area of a portion where the cutout 49 or the through hole 51 is not formed) of the shunt resistor body part 9. The cross-sectional area of the shunt resistor body part 9 is an area of a cross-section on a plane orthogonal to the longitudinal direction.

Figure 12A:
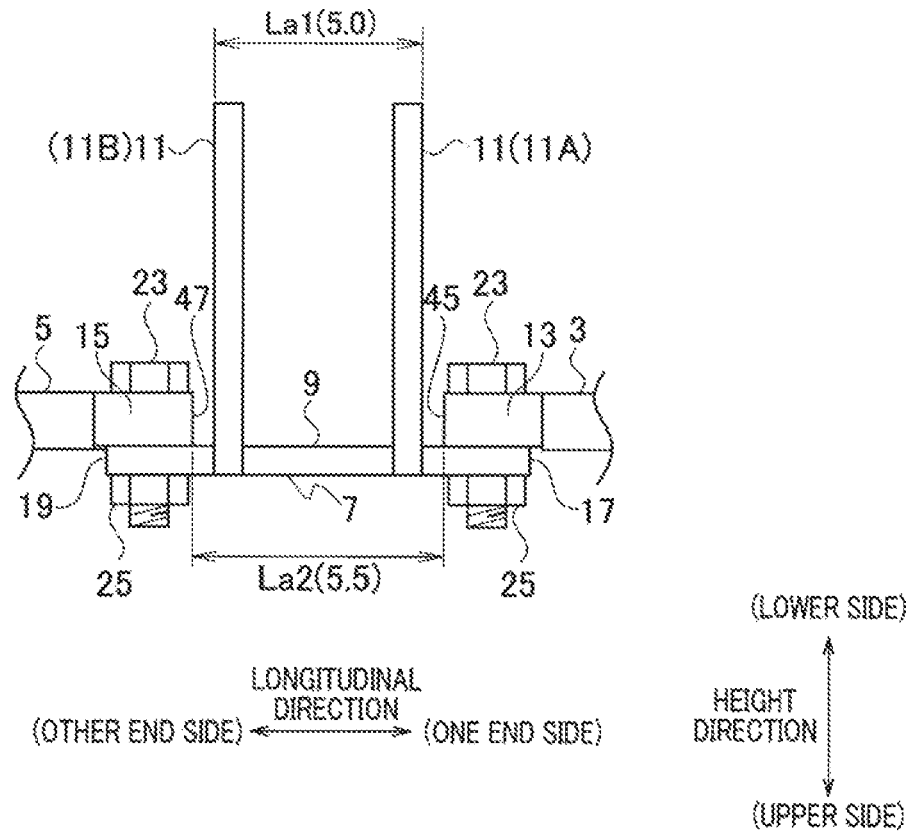
FIG. 12A is an enlarged view of XIIA portion in FIG. 9, and is a view illustrating a fixing form of a shunt resistor on a bus bar.

As illustrated in FIG. 12A, a value of a dimension La2 in a longitudinal direction of an interval between a portion (side surface 45) where the shunt resistor body part 9 of the first bus bar 3 is bonded and a portion (side surface 47) where the shunt resistor body part 9 of the second bus bar 5 is bonded becomes 110% or more (for example, 110% or more and 200% or less) with respect to an outer dimension La1 of the pair of detection terminals 11 (11A and 11B) in a longitudinal direction.

More specifically, the outer dimension La1 of the pair of detection terminals 11 (11A and 11B) in the longitudinal direction is a distance between a portion of one detection terminal 11A farthest away from the other detection terminal 11B in the longitudinal direction and a portion of the other detection terminal 11B farthest away from the one detection terminal 11A in the longitudinal direction. The dimension La1 is, for example, 5 mm. The dimension La2 is, for example, 5.5 mm.

More specifically, when viewed in the height direction, the outer dimension La1 of the pair of detection terminals 11 (11A and 11B) is a distance in the longitudinal direction between one side (a side stretched in the lateral direction and positioned on the opposite side of the other detection terminal 11B) of the one detection terminal 11A having a rectangular shape and one side (a side stretched in the lateral direction and positioned on the opposite side of the one detection terminal 11A) of the other detection terminal 11B having a rectangular shape.

In the above description, the shunt resistor 7 having the shunt resistor body part 9 and the detection terminal 11 are integrally made of the same material, but the shunt resistor body part 9 and the detection terminal 11 may be made of different materials. For example, the shunt resistor body part 9 may be made of an alloy having good temperature characteristics, the detection terminal 11 may be made of copper or the like, and the detection terminal 11 may be bonded to the shunt resistor body part 9.

Next, a method for manufacturing a sensor 1 will be described.

The first bus bar 3, the second bus bar 5, and the shunt resistor 7 are bonded by using the bolt 23 and the nut 25, the bonded components, the terminal 29, and the bolt 33 are positioned by a jig (not illustrated), and the housing 27 is provided by mold molding.

Subsequently, the circuit board 21 is fixed, the circuit board 21 is sealed with the sealing material 31, and the bolt 35, the washer 37, and the nut 39 are fixed on the first bus bar 3.

An operation of the sensor 1 will be described. In an initial state, it is assumed that the sensor 1 is fixed in the battery BT, and the sensor 1 is connected to driven devices supplied with power from the battery BT.

In the initial state, when a current flows from the battery BT to the devices, the current flows through the first bus bar 3, the shunt resistor 7 (shunt resistor body part 9), and the second bus bar 5 in this order.

In such a state where the current is flowing, a potential difference occurs between one detection terminal 11A and the other detection terminal 11B. The occurring potential difference is input to the circuit board 21, and an output corresponding to the current value is made from the terminal 29.

The sensor 1 includes, the first bus bar 3, the second bus bar 5, and the shunt resistor 7, and the shunt resistor 7 is configured to include the shunt resistor body part 9 and the detection terminal 11 extending from the shunt resistor body part 9. With this configuration, there is no need to separately fix the detection terminal on the bus bar.

With such a structure, the configuration of the sensor 1 is simple, and the manufacturing cost thereof can be reduced. In addition, a position shift of the detection terminal 11 with respect to the shunt resistor body part 9 does not occur, and when a current flows from the first bus bar 3 to the second bus bar 5 through the shunt resistor 7, a value of a voltage between the pair of detection terminals 11 (11A and 11B) or a current flowing from the first bus bar 3 to the second bus bar 5 through the shunt resistor 7 can be accurately detected. Furthermore, since the bus bars 3 and 5 have worse temperature characteristics than the shunt resistor 7, if extraction pins (detection terminals) from the bus bars 3 and 5 are erected, the extraction pins are affected, but since, in the sensor 1, the extraction pins from the bus bars 3 and 5 are not erected, the value of the current can be accurately detected.

According to the sensor 1, since the detection terminal 11 is bonded to the detection terminal bonded portion of the circuit of the circuit board 21, the configuration is further simplified, and when the current flows from the first bus bar 3 to the second bus bar 5 through the shunt resistor 7, the voltage or the like between the pair of detection terminals 11 (11A and 11B) can be detected even more accurately.

According to the sensor 1, since the shunt resistor 7 is bonded to each of the bus bars 3 and 5 using the bolt 23 and the nut 25, the size can be reduced and the detection accuracy of the voltage and current can be improved.

For example, in a structure in which a heat capacity of the bus bars 3 and 5 is larger than the heat capacity of the shunt resistor 7, in the case where a shunt resistor with a small heat capacity is soldered, when the solder is heated to be melted, the temperature of the shunt resistor with a small heat capacity rises first as compared with the bus bar, and the solder is soaked up to the shunt resistor whose temperature has risen first, which may cause a short circuit due to the solder.

The short circuit occurs, and therefore the detection accuracy of the voltage and the current deteriorates.

When the terminal shape is provided on the bus bar, if the distance (gap) between the pair of bus bars is increased to avoid the short circuit, the shunt resistor will be increased, but a conduction distance in the bus bar other than the shunt resistor extends, and the bus bar having worse temperature characteristics than the shunt resistor has an adverse effect, such that the detection accuracy of the voltage or current may be slightly reduced.

However, since the sensor 1 does not use solder for bonding the shunt resistor 7 and each of the bus bars 3 and 5, the occurrence of the above-described short circuit and the like are avoided, the sensor 1 can be miniaturized, and the detection accuracy of voltage and current can be improved.

According to the sensor 1, since the pair of detection terminals 11 (11A and 11B) are separated from each other in the longitudinal direction which is a direction in which the current flows and arranged side by side, the voltage or the like between the pair of detection terminals 11 (11A and 11B) can be reliably detected when the current flows from the first bus bar 3 to the second bus bar 5 through the shunt resistor 7 (shunt resistor body part 9).

According to the sensor 1, as illustrated in FIG. 12A, the value of the dimension La2 in the longitudinal direction of a gap between a side surface 45 of the first shunt resistor fixing part 13 and a side surface 47 of the second shunt resistor fixing part 15 becomes 110% or more with respect to the value of the outer dimension La1 of the pair of detection terminals 11 (11A and 11B) in the longitudinal direction, and thus, the voltage or the like between the pair of detection terminals 11 (11A and 11B) can be reliably detected when the current flows from the first bus bar 3 to the second bus bar 5 through the shunt resistor 7.

In other words, when a current flows through the bus bars 3 and 5 and the shunt resistor 7, since the current flows only in the shunt resistor body part 9 substantially in the longitudinal direction between the pair of detection terminals 11 (11A and 11B), there is no variation in voltage or the like generated between the pair of detection terminals 11 (11A and 11B) without being affected by the bus bars 3 and 5.

This will be described with reference to FIG. 13B. A horizontal axis in FIG. 13B indicates the interval (dimension La2 of the gap between the side surface 45 and the side surface 47 in the longitudinal direction) between the bus bars 3 and 5 when the outer dimension La1 of the pair of detection terminals 11 (11A and 11B) in the longitudinal direction is 5 mm, and a vertical axis in FIG. 13B indicates the voltage generated in the pair of detection terminals 11 (11A and 11B). A diagram G12B indicates a relationship (simulation analysis result) between the dimension La2 and the voltage.

Figure 13A:
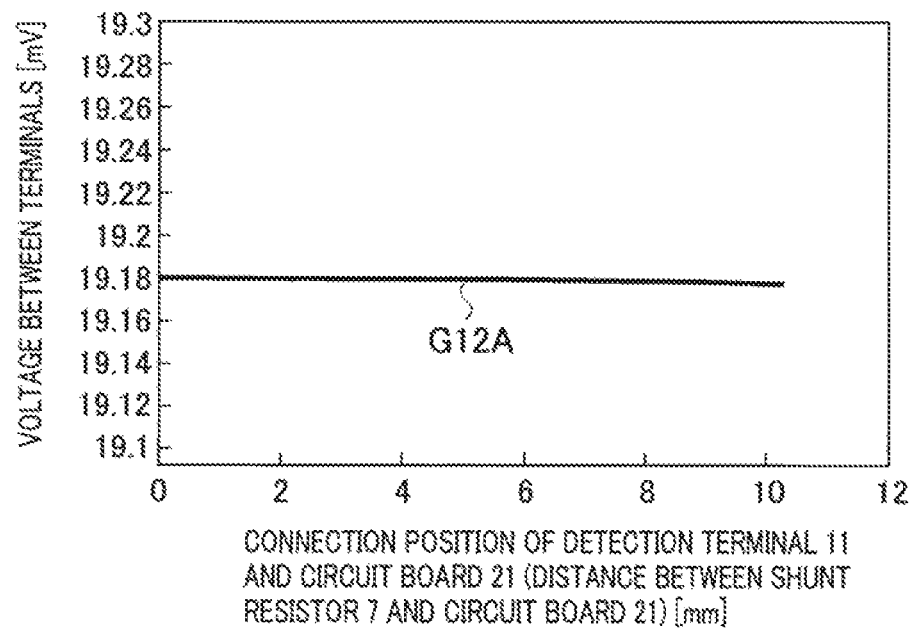
FIG. 13A is a view illustrating the relationship between a connection position (distance between the shunt resistor and the circuit board) between detection terminals and the circuit board and a voltage between the detection terminals.
Figure 13B:
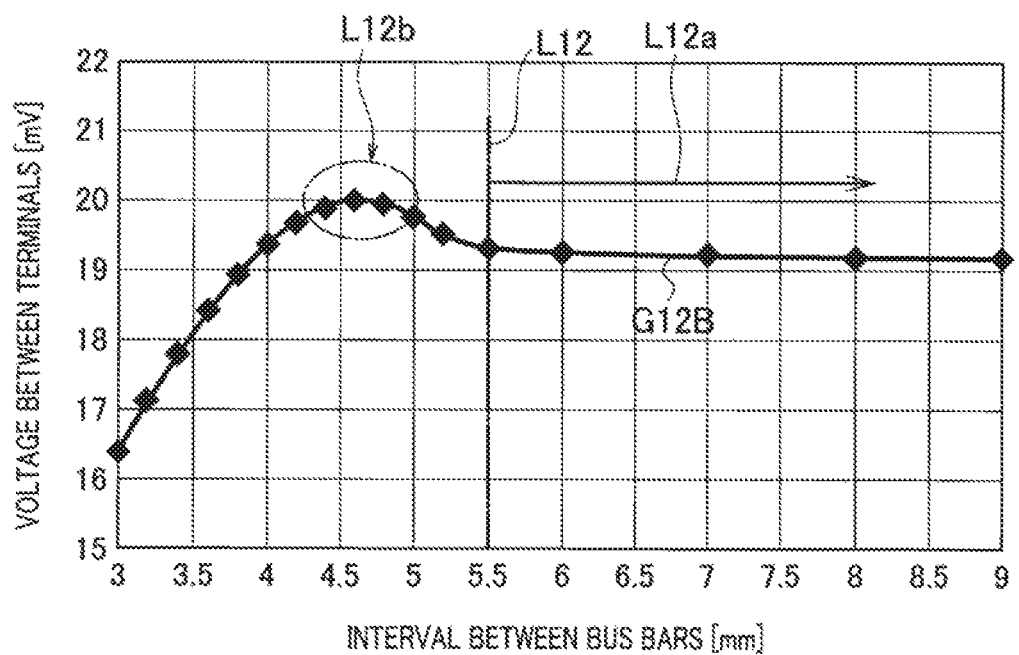
FIG. 13B is a view illustrating the relationship between an interval between the bus bar interval and the voltage between the detection terminals.
Figure 14C:
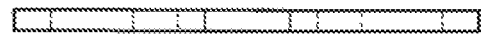
Figure 14C:
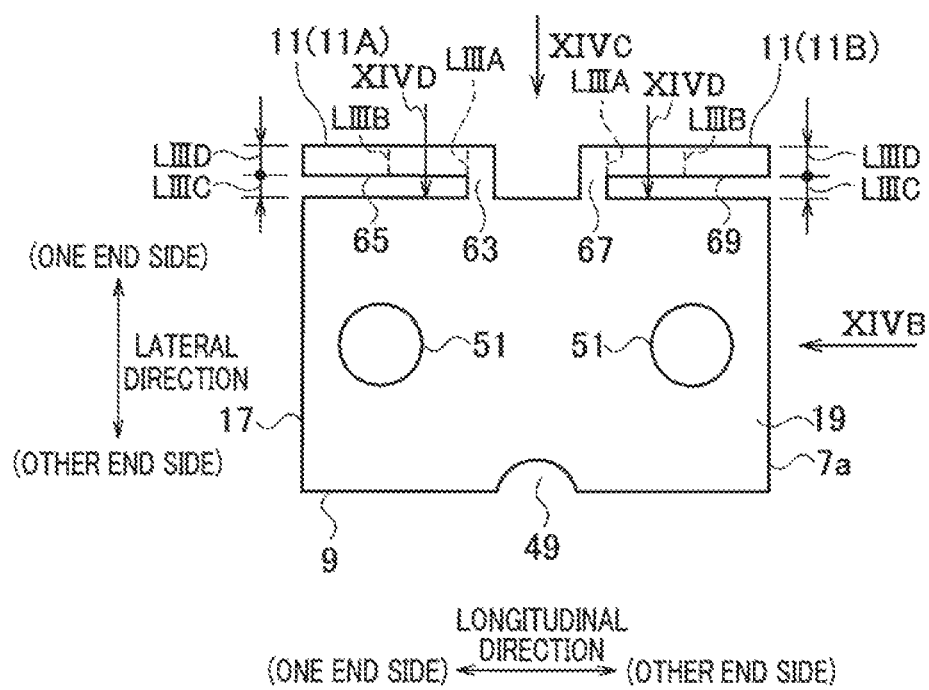
Figure 14C:
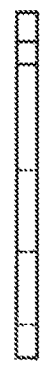
Figure 14D:
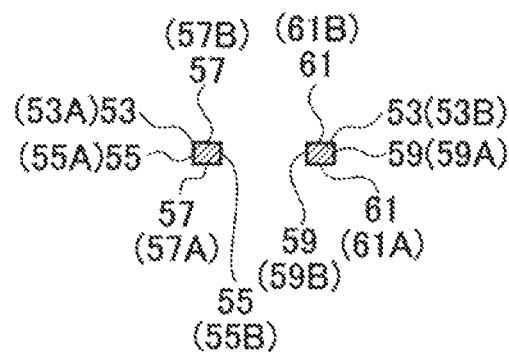

The conditions in which the simulation analysis result of FIG. 13B is obtained are illustrated. The value of the current flowing in the bus bars 3 and 5 and the shunt resistor 7 is a constant value of 100 A. As the shunt resistor, a shunt resistor 7a illustrated in FIG. 15 described later in detail was used. The shunt resistor 7a is made of a Cu—Mn—Ni alloy. As the bus bars 3 and 5, those in which a surface of the Cu alloy is plated with Sn were used.

If the diagram G12B illustrated in FIG. 13B is determined by actual measurement, there is a position shift in the actual measurement at the time of the connection of the shunt resistor 7, which results in an error and is difficult to quantify. In particular, when the gap (bus bar interval; a distance between the side surface 45 and the side surface 47 that is the gap between the bus bars 3 and 5) is narrower than a location indicated by a line segment L12, the voltage between terminals tends to be increased (see a gap between L12 and L12b in FIG. 13B), and the voltage between the terminals is greatly shifted even with a little position shift.

Figure 15:
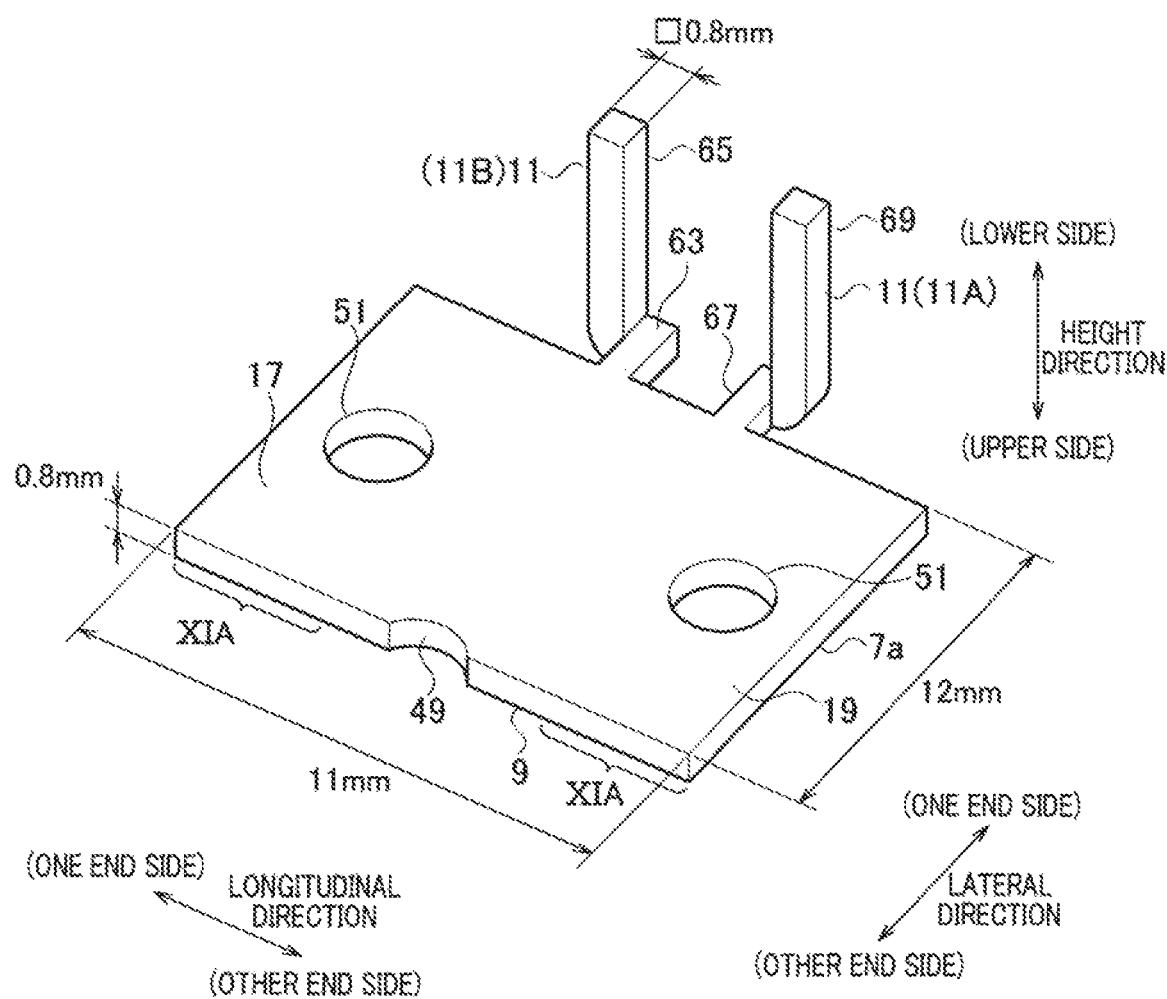
FIG. 15 is a perspective view of the shunt resistor illustrated in FIGS. 14A to 14D.

In the form of the fixing of the shunt resistor 7a on the bus bars 3 and 5, a value of a width dimension of the first shunt resistor fixing part 13 of the bus bar 3 is larger than that of the first bus bar contact part 17 of the shunt resistor 7a, and a value of a width dimension of the second shunt resistor fixing part 15 of the bus bar 5 is larger than that of the second bus bar contact part 19 of the shunt resistor 7a. The first bus bar contact part 17 (the entire lower surface of the rectangular shape of the first bus bar contact part 17) indicated by reference sign XIA (reference sign XIA on the left side) in FIG. 15 is in surface contact with the first shunt resistor fixing part 13 of the bus bar 3, and the first bus bar contact part 17 (the entire lower surface of the rectangular shape of the first bus bar contact part 17) indicated by reference numeral XIA (reference numeral XIA on the right side) in FIG. 15 is in surface contact with the second shunt resistor fixing part 15 of the bus bar 3. However, as a matter of course, the detection terminals 11A and 11B of the shunt resistor 7a are not in contact with the bus bar 3 or the bus bar 5.

As understood from FIG. 13B, in the range (range indicated by reference numeral L12a) on the right side of the line segment L12, the value of the dimension La2 becomes 110% or more of the value of the dimension La1, and the voltage generated in the pair of the detection terminals 11 (11A and 11B) is constant.

FIG. 13A illustrates the relationship (measurement result) between the connection location of the detection terminal 11 (11A and 11B) and the voltage. The measurement result illustrated in FIG. 13A is also obtained under the same conditions as when the measurement result illustrated in FIG. 13B was obtained. The horizontal axis in FIG. 13A indicates a distance (distance in the height direction) between the connection location (connection location with the detection terminal bonded portion of the circuit board 21) of the pair of detection terminals 11 (11A and 11B) and the shunt resistor body part 9. The vertical axis of FIG. 13A indicates the voltage generated in the pair of detection terminals 11 (11A and 11B). As illustrated by the diagram G12A, the voltage generated in the pair of detection terminals 11 (11A and 11B) is constant regardless of the connection location of the pair of detection terminals 11 (11A and 11B).

Therefore, even if there is the position shift of the connection point between the detection terminal 11 (11A and 11B) and the detection terminal bonded portion of the circuit board 21, the detection accuracy of the current value and the like does not deteriorate.

If the pair of detection terminals 11 (11A and 11B) enters the gap between the respective bus bars 3 and 5 (between the side surface 45 and the side surface 47) in the longitudinal direction, even when the fixing position of the shunt resistor 7 with respect to each bus bar 3 and 5 in longitudinal direction is slightly shifted, the voltage or the like generated between the pair of detection terminals 11 (11A and 11B) can be detected almost accurately without being affected by the shift.

Therefore, when a plurality of sensors 1 are manufactured, the individual differences of the sensors 1 are absorbed by changing and adjusting the form of the trimmed cutout 49. Further, since the error at the time of connecting the shunt resistor 7 is reduced, the gain adjustment using a microcomputer or the like becomes unnecessary. Since the function is eliminated, the circuit of the circuit board 21 is simplified and the number of components is reduced, so the failure rate is reduced and the price also falls.

According to the sensor 1, since the shunt resistor body part 9 and the detection terminal 11 are formed of the same member, if the shunt resistor 7 is integrally formed from a material by press working or the like, the shunt resistor 7 having good shape accuracy can be obtained by the simple manufacturing process without fixing the separate detection terminal and the current value and the like can be accurately detected by using the shunt resistor 7.

Figure 12B:
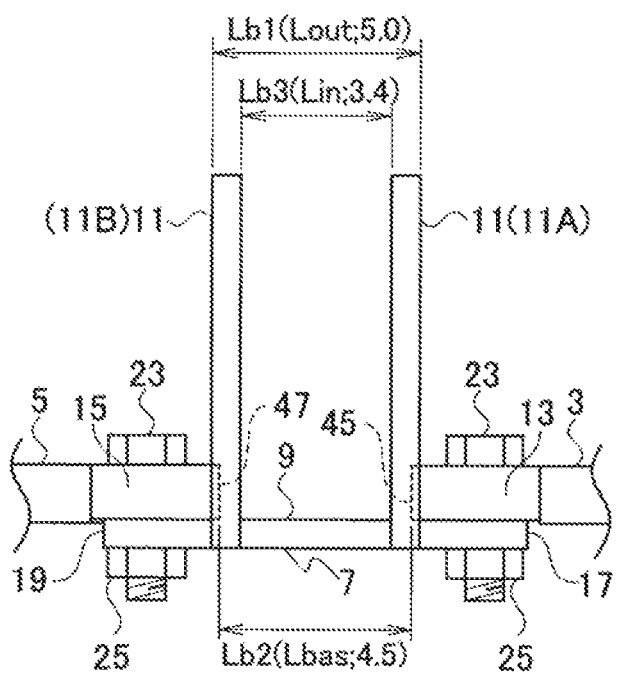
FIG. 12B is a view illustrating a modified example of the fixing form of FIG. 12A.

The distance in the longitudinal direction between the side surface 45 of the first shunt resistor fixing part 13 of the first bus bar 3 and the side surface 47 of the second shunt resistor fixing part 15 of the second bus bar 5 may be as illustrated in FIG. 12B. Even in this case, a diagram illustrating the relationship between the interval between the bus bars 3 and 5 and the voltage between the detection terminals 11 illustrated in FIG. 13B can be obtained.

As illustrated in FIG. 12B, a value of a dimension Lbas (Lb2), in a longitudinal direction, of the interval between the portion (side surface 45) where the shunt resistor body part 9 of the first bus bar 3 is bonded and the portion (side surface 47) where the shunt resistor body part 9 of the second bus bar 5 is bonded is smaller than a value of an outer dimension Lout (Lb1) of the pair of detection terminals 11 (11A and 11B) in the longitudinal direction, and is larger than a value of an inner dimension Lin (Lb3) of the pair of detection terminals 11 (11A and 11B) in the longitudinal direction.

The inner dimension (inner distance) Lin of the pair of detection terminals 11 (11A and 11B) in the longitudinal direction is a distance between a portion of one detection terminal 11A closest to the other detection terminal 11B in the longitudinal direction and a portion of the other detection terminal 11B closest to the one detection terminal 11A in the longitudinal direction.

That is, when viewed in the height direction, the inner dimension Lin of the pair of detection terminals 11 (11A and 11B) is a distance in the longitudinal direction between one side (a side stretched in the lateral direction and positioned to the other detection terminal 11B side) of the one detection terminal 11A having a rectangular shape and one side (a side stretched in the lateral direction and positioned to the one detection terminal 11A side) of the other detection terminal 11B having a rectangular shape.

The configuration illustrated in FIG. 12B will be further described.

A ratio ((Lbas−Lin)/(Lout−Lin)) of a difference (Lbas−Lin) between the value of the dimension Lbas and the value of the inner dimension Lin and a difference (Lout−Lin) between the value of the outer dimension Lout and the value of the inner dimension Lin is set to be a ratio at which an error in the measured value of the current flowing between the pair of bus bars 3 and 5 falls within a range of an allowable value, or a ratio at which the error in the measured value of the voltage between the pair of bus bars 3 and 5 falls within the range of an allowable value. By having a structure of such a ratio, a fluctuation range of the measured value of the current flowing between the pair of bus bars 3 and 5 under a constant voltage with respect to the fluctuation of the dimension Lbas can be within an allowable predetermined range. Alternatively, the fluctuation range of the measured value of the voltage flowing between the pair of bus bars 3 and 5 under a constant current with respect to the fluctuation of the dimension Lbas can be within an allowable predetermined range.

If the configuration illustrated in FIG. 12B will be specifically described with reference to an example, the value of (gap dimension value Lbas−inner dimension value Lin)/ (outer dimension value Lout−inner dimension value Lin) is a range of 72% to 78%. The range of 72% to 78% is preferably in the range of 73% to 77%, and the range of 73% to 77% is more preferably in the range of 74% to 76%, still more preferably in the range of 74.5% to 75.5%, and even more preferably 75%.

In other words, when the value of the inner dimension Lin is 0% and the value of the outer dimension Lout is 100%, the value of the gap dimension Lbas is in the above range or value.

In the configuration illustrated in FIG. 12B, the value of the outer dimension Lout (Lb1) is 5.0 mm, the value of the dimension Lbas (Lb2) is 4.5 mm, and the value of the inner dimension Lin (Lb3) is 3.4 mm.

The range of 72% to 78% or the like described above indicates a location indicated by reference sign L12b in FIG. 13B, a location indicated by reference sign L12b is an apex (peak) of a mountain of the diagram G12B or a location in the vicinity thereof. Here, the change in the voltage between the detection terminals 11A and 11B is small.

A trend (trend of a diagram shape) of a waveform of the diagram G12B illustrated in FIG. 13B does not change even if the material or thickness (value of 0.8 mm illustrated in FIG. 15) of the bus bars 3 and 5 or the shunt resistor 7a changes. That is, in the range indicated by reference sign L12a, the voltage generated in the pair of detection terminals 11 (11A and 11B) becomes constant, and the above-described range of 72% to 78% or the like becomes the apex (peak) of the mountain of the diagram G12B or the location in the vicinity thereof in the location indicated by reference sign L12b. In the shunt resistor 7, by adopting the configuration of the peak of the diagram G12B or the location in the vicinity thereof, the resistance value can be increased with the small size and the size of the entire product (sensor 1) can be reduced. Further, even with the same resistance value, the current flows in a short distance by the shunt resistor 7, so a heat value can be reduced.

In the shunt resistor 7, in the case of adopting the configuration using the peak of the diagram G12B or the location in the vicinity thereof, since the resistance value changes at the connection position with respect to the terminal width, in terminals (detection terminals 11A and 11B in which the gap in the longitudinal direction is large) having a narrow width, the connection accuracy becomes strict (it is necessary to make the accuracy of the fixing position of the shunt resistor 7 with respect to the bus bars 3 and 5 strict). Therefore, when the mounting accuracy at the time of manufacturing is rough and the terminal width is narrow, the terminals are a region in which the fluctuation is large, and therefore the configuration should not be adopted.

The outer distance (distance indicated by reference sign La1 in FIG. 12A or distance indicated by the reference sign Lb1 in FIG. 12B) of the pair of detection terminals 11 (11A and 11B) or the inner distance (distance indicated by reference sign Lb3 in 12B) of the pair of detection terminals 11 (11A and 11B) will be further described.

As illustrated in FIG. 11D, a boundary surface 53 (53A) between the shunt resistor body part 9 and the one detection terminal 11A in the shunt resistor 7 is a rectangle (for example, square) when viewed in the lateral direction. A pair of sides 55 (55A and 55B) facing each other among four sides of the square boundary surface 53A extends in the height direction in parallel with each other. The other pair of sides 57 (57A and 57B) facing each other among the four sides of the square boundary surface 53A extends in the longitudinal direction in parallel with each other.

A boundary surface 53 (53B) between the shunt resistor body part 9 and the other detection terminal 11B in the shunt resistor 7 is a rectangle (for example, square) when viewed in the lateral direction. A pair of sides 59 (59A and 59B) facing each other among four sides of the square boundary surface 53B extends in the height direction in parallel with each other. The other pair of sides 61 (61A and 61B) facing each other among the four sides of the square boundary surface 53B extends in the longitudinal direction in parallel with each other.

An outer distance LX1 of the pair of detection terminals 11 (11A and 11B) is a distance in the longitudinal direction between one side (surface positioned on the opposite side to the boundary surface 53B of the other detection terminal 11B) 55A of a pair of sides 55 extending in the height direction of the boundary surface 53A of one detection terminal 11A, and one side (surface positioned on the opposite side to the boundary surface 53A of one detection terminal 11A) 59A of a pair of sides 59 extending in the height direction of the boundary surface 53B of the other detection terminal 11B.

An inner distance LX2 of the pair of detection terminals 11 (11A and 11B) is a distance in the longitudinal direction between the other side (surface positioned on the boundary surface 53B of the other detection terminal 11B) 55B of the pair of sides 55 extending in the height direction of the boundary surface 53A of the one detection terminal 11A, and the other side (surface positioned on the boundary surface 53A of one detection terminal 11A) 59B of the pair of sides 59 extending in the height direction of the boundary surface 53B of the other detection terminal 11B.

If the outer distance LX1 of the pair of detection terminals 11 and the inner distance LX2 of the pair of detection terminals 11 are interpreted in this way, each of the pair of detection terminals 11 may be bent as appropriate in the middle of these stretching directions.

A shape of the boundary surface 53A of the one detection terminal 11A and a shape of a cross section (cross section by a plane orthogonal to the stretching direction; cross section by a plane orthogonal to the height direction) of the one detection terminal 11A match each other, but the shape of the boundary surface 53A of the one detection terminal 11A and the shape of the cross section of the one detection terminal 11A may be different from each other. In this case, it is preferable that an area (area of a cross section at an arbitrary position) of the cross section of the one detection terminal 11A is larger than that of the boundary surface 53A of the one detection terminal 11A.

Similarly, the shape of the boundary surface 53B of the other detection terminal 11B and the shape of the cross section of the other detection terminal 11B match each other, but the shape of the boundary surface 53B of the other detection terminal 11B and the shape of the cross section of the other detection terminal 11B may be different from each other. Even in this case, it is desirable that an area (area of a cross section at an arbitrary position) of the cross section of the other detection terminal 11B is larger than that of the boundary surface 53B of the other detection terminal 11B.

According to the sensor 1, the ratio of the difference between the dimension Lbas of the gap between the first bus bar 3 and the second bus bar 5 in the longitudinal direction and the inner dimension Lin of the pair of detection terminals 11 in the longitudinal direction and the difference between the outer dimension Lout of the pair of detection terminals 11 in the longitudinal direction and the inner dimension Lin of the pair of detection terminals 11 in the longitudinal direction is set to be a ratio at which the error in the measured value of the current flowing between the pair of bus bars 3 and 5 is within the range of the allowable value or a ratio at which the error in the measured value of the voltage between the pair of bus bars 3 and 5 is within the range of the allowable value. By having a structure of such a ratio, a fluctuation range of the measured value of the current flowing between the pair of bus bars 3 and 5 under a constant voltage with respect to the fluctuation of the dimension Lbas can be within an allowable predetermined range. Alternatively, the fluctuation range of the measured value of the voltage flowing between the pair of bus bars 3 and 5 under a constant current with respect to the fluctuation of the dimension Lbas can be within an allowable predetermined range. The value of the ratio is set to, for example, about 75%. With such a structure, the size of the sensor 1 can be reduced, and when a current flows from the first bus bar 3 to the second bus bar 5 through the shunt resistor 7, the current value or the like between the pair of detection terminals 11 can be accurately detected.

The reason why in the portion L12b of the diagram G12B in FIG. 13B, the diagram G12B reaches the peak value (maximum value of the voltage generated in the pair of detection terminals 11 (11A and 11B)) is considered that a current spreads to the detection terminal 11 side and a current path extends since the terminal branch portion and the bus bar overlap when a current flows from the bus bar 3 and 5 with a small electric resistance to the shunt resistor body part 9 with a large electric resistance value.

The shunt resistor 7 may be modified into the shunt resistor 7a as illustrated in FIGS. 14A to 14D and 15. In the shunt resistor 7a illustrated in FIGS. 14A to 14D and 15, the shape of the pair of detection terminals 11 is different from the shunt resistor 7 illustrated in FIGS. 11A to 11D and the like, and other points are formed and used in the same way as the shunt resistor 7 illustrated in FIGS. 11A to 11D and the like. Note that FIG. 15 illustrates a completed product of the shunt resistor 7a, and FIGS. 14A to 14D illustrate a semi-finished product of the shunt resistor 7a before the pair of detection terminals 11 is bent.

The shunt resistor 7a illustrated in FIGS. 14A to 14D and 15 includes the shunt resistor body part 9, the first detection terminal 11A, and the second detection terminal 11B. The shunt resistor body part 9 is formed in a plate shape (for example, a rectangular flat plate shape).

The first detection terminal 11A extends from the shunt resistor body part 9 and the second detection terminal 11B extends from the shunt resistor body part 9 away from the first detection terminal 11A.

The first detection terminal 11A has a first connecting part 63 slightly protruding from an edge of the shunt resistor body part 9 to one end thereof in the lateral direction, and a first terminal body part 65 extending from a tip of the first connecting part 63.

As illustrated in FIG. 15, the first terminal body part 65 extends from the tip of the first connecting part 63 to one side (lower side in the height direction) of the shunt resistor body part 9 in the thickness direction. Note that the extension direction (longer direction) of the first terminal body part 65 is orthogonal to the thickness direction of the shunt resistor body part 9, but it is not necessarily required to be orthogonal, and the longer direction of the first terminal body part 65 may intersect at a predetermined angle with respect to the thickness direction of the shunt resistor body part 9.

The first terminal body part 65 may be along the stretching direction (longitudinal direction) of the edge of the shunt resistor body part 9 and extend in the direction away from the second detection terminal 11B from the tip of the first connecting part 63 to the middle portion of the first terminal body part 65 in the longer direction (extending direction), and may extend to one side of the shunt resistor body part 9 in the thickness direction from the middle portion of the first terminal body part 65 in the longer direction to the tip of the first terminal body part 65 in the longer direction.

In the same way as the first detection terminal 11A, the second detection terminal 11B has a second connecting part 67 slightly protruding from the edge of the shunt resistor body part 9 to one end thereof in the lateral direction, and a second terminal body part 69 extending from a tip of the second connecting part 67.

The second terminal body part 69 extends from the tip of the second connecting part 67 to one side (lower side in the height direction) of the shunt resistor body part 9 in the thickness direction.

The second terminal body part 69 may be along the stretching direction (longitudinal direction) of the edge of the shunt resistor body part 9 and extend in the direction away from the first detection terminal 11A from the tip of the second connecting part 67 to the middle portion of the second terminal body part 69 in the longer direction (extending direction), and may extend to one side of the shunt resistor body part 9 in the thickness direction from the middle portion of the second terminal body part 69 in the longer direction to the tip of the second terminal body part 69 in the longer direction.

More specifically, in the embodiment illustrated in FIG. 15, the first detection terminal 11A (second detection terminal 11B) may be bent at the location indicated by reference sign LIIIA in FIGS. 14A to 14D, but the first detection terminal 11A (second detection terminal 11B) may be bent at a location indicated by reference sign LIIIB in FIGS. 14A to 14D.

In the shunt resistor 7a illustrated in FIGS. 14A to 14D and 15, a value of a dimension LIIIC of the gap between the shunt resistor body part 9 and the first terminal body part 65 (second terminal body part 69) of the detection terminal 11A (detection terminal 11B) in the lateral direction becomes smaller than a value of a dimension LIIID of the first terminal body part 65 (second terminal main body part 69) in the lateral direction.

According to the shunt resistor 7a illustrated in FIG. 15, since each detection terminal 11 (11A and 11B) protrudes from the shunt resistor body part 9 as described above, material waste can be minimized when the shunt resistor 7 is manufactured by press working or the like from a flat material.

The shunt resistor body part 9 may be bonded to the first bus bar 3 and the second bus bar 5 on the circuit board 21 side.

More specifically, in the embodiment illustrated in FIGS. 12A and 12B and the like, the shunt resistor body part 9 is arranged above (on an opposite side to the circuit board 21)

of the first shunt resistor fixing part 13 of the first bus bar 3 and the second shunt resistor fixing part 15 of the second bus bar 5 and bonded thereto.

Figure 16:
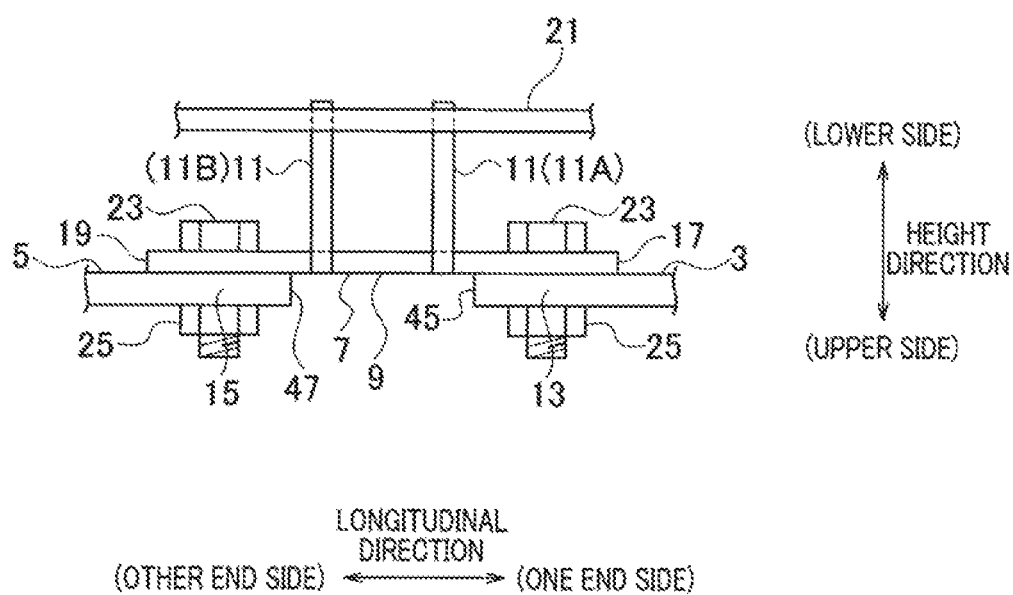
FIG. 16 is a view illustrating a modified example of a fixing form of the shunt resistor on the bus bar, and is a view corresponding to FIG. 12A.

On the other hand, as illustrated in FIG. 16, in the state in which the shunt resistors 7 and 7a (shunt resistor body part 9) illustrated in FIGS. 11A to 11D and 15 are fixed on the first bus bar 3 (first shunt resistor fixing part 13) and the second bus bar 5 (second shunt resistor fixing part 15), the shunt resistor body part 9 may be arranged below (circuit board 21 side) the first shunt resistor fixing part 13 of the first bus bar 3 and the second shunt resistor fixing part 15 of the second bus bar 5 and bonded thereto.

That is, the upper surface of the first bus bar contact part 17 of the shunt resistor body part 9 and the lower surface of the first shunt resistor fixing part 13 of the first bus bar 3 may be in surface contact with each other, and the upper surface of the second bus bar contact part 19 of the shunt resistor body part 9 and the lower surface of the second shunt resistor fixing part 15 of the second bus bar 5 may be in surface contact with each other.

As a result, the distance between the shunt resistor body part 9 and the circuit board 21 in the height direction can be smaller than that illustrated in FIGS. 12A and 12B and the like, a protruding length of the detection terminal 11 from the shunt resistor body part 9 can be reduced, waste of material when manufacturing the shunt resistor 7 can be reduced, and the amount of material used can be reduced.

Figure 17A:
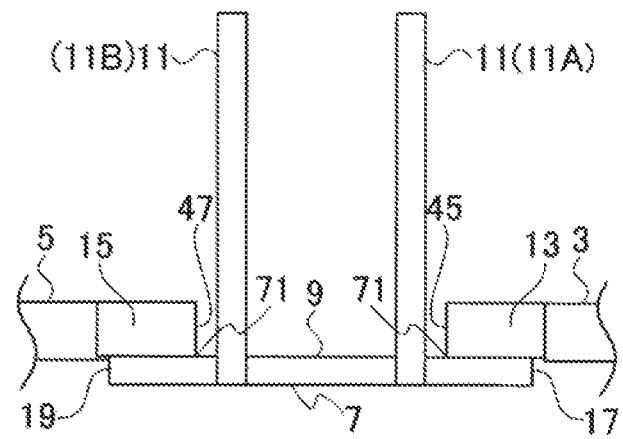
FIGS. 17A to 17C are views illustrating a modified example of the fixing form of the shunt resistor on the bus bar, where
Figure 17B:
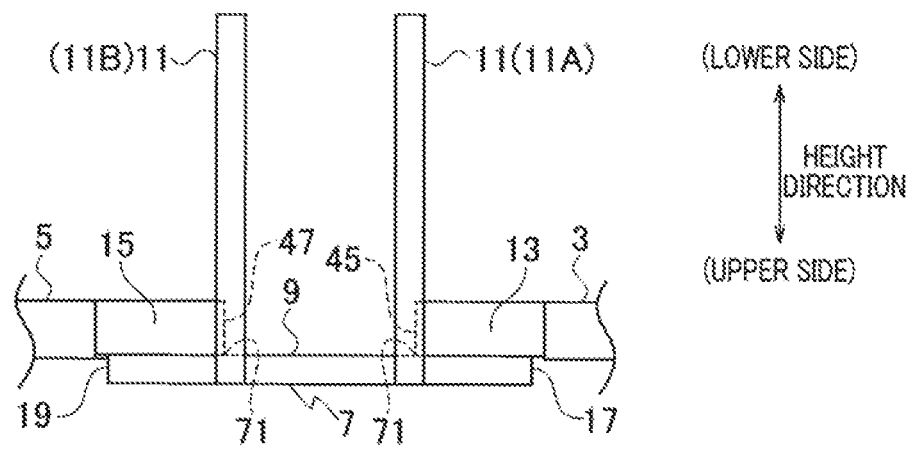
Figure 17C:
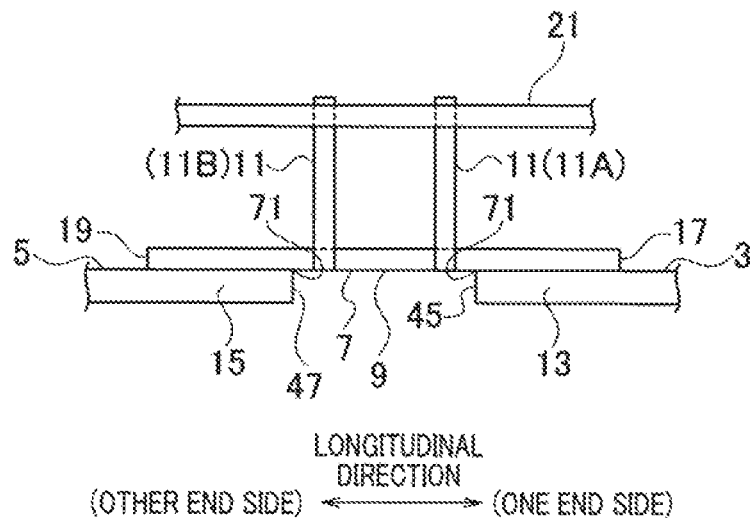

In the description so far, the shunt resistors 7 and 7a are fixed on the bus bars 3 and 5 using the fixing tool such as the bolt 23 or the nut 25, but as illustrated in FIGS. 17A to 17C described above, the shunt resistors 7 and 7a may be fixed on the bus bars 3 and 5 by welding (for example, ultrasonic welding) or the like.

Even when the shunt resistors 7 and 7a are fixed on the bus bars 3 and 5 by welding or the like, the entire surface of the first bus bar contact part 17 of the shunt resistors 7 and 7a are in surface contact with the first shunt resistor fixing part 13 of the bus bar 3, and the entire surface of the second bus bar contact part 19 of the shunt resistors 7 and 7a is in surface contact with the second shunt resistor fixing part 15 of the bus bar 5.

When the shunt resistors 7 and 7a are fixed on the bus bars 3 and 5 by the welding or the like, the through hole 51 illustrated in FIGS. 11A to 11D or FIG. 15 is eliminated, for example, and no protrusion is present on an outer periphery (four sides of a rectangular plane) or in the vicinity of the outer periphery of a surface (for example, rectangular plane) on which the shunt resistors 7 and 7a are in contact with the first shunt resistor fixing part 13. Similarly, no protrusion is present on the outer periphery or in the vicinity of the outer periphery of the surface on which the shunt resistors 7 or 7a are in contact with the second shunt resistor fixing part 15.

For example, no welding location appearing at the time of, for example, fillet welding is present at a corner (one side of the shunt resistors 7 and 7a; corner formed by the first shunt resistor fixing part 13 and the shunt resistors 7 and 7a) 71 of the first shunt resistor fixing part 13 illustrated in FIGS. 17A to 17C. Similarly, no welding location is present at a corner 71 of the second shunt resistor fixing part 15.

Even when the shunt resistors 7 and 7a are fixed on the bus bars 3 and 5 by the welding or the like, diagrams (measurement results) similar to the diagrams G12A and G12B illustrated in FIGS. 13A and 13B can be obtained.

Figure 18:
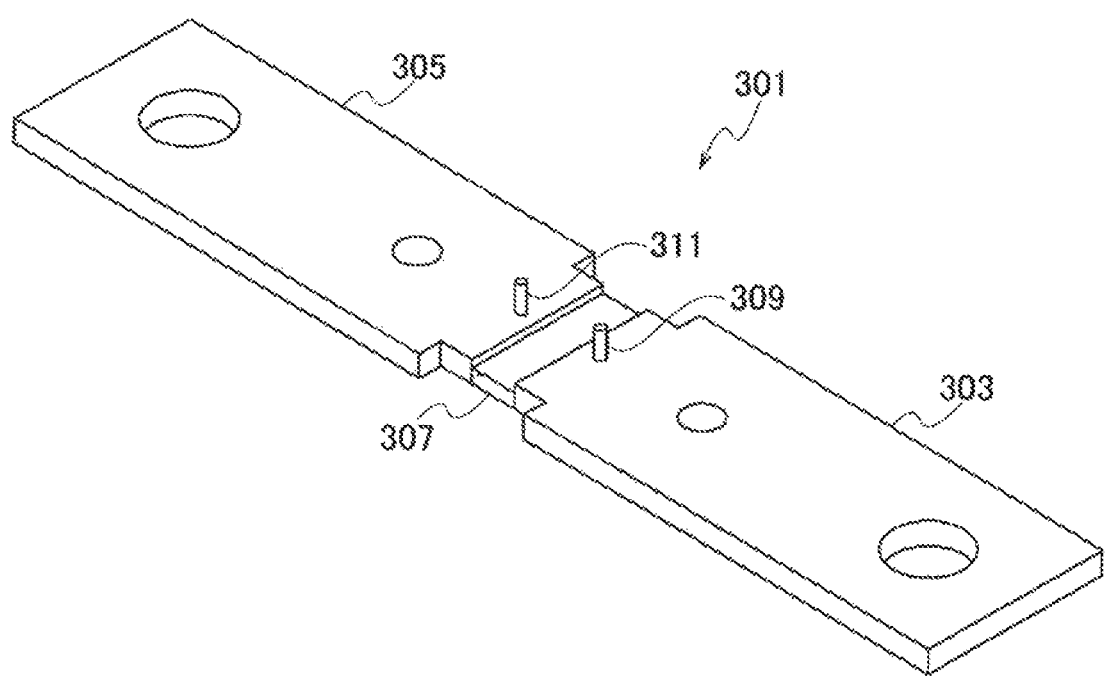
FIG. 18 is a diagram illustrating a bus bar and a shunt resistor in the sensor according to the comparative example.

Next, comparative example will be described. As illustrated in FIG. 18, a shunt resistor device 301 according to comparative example includes a pair of bus bars 303 and 305, and a shunt resistor 307 sandwiched between the bus bars 303 and 305.

One bus bar 303 is provided with a detection terminal 309, and the other bus bar 305 is provided with a detection terminal 311.

When a current flows from the bus bar 303 to the bus bar 305 through the shunt resistor 307, a voltage between the pair of detection terminals 309 and 311 or a current flowing from the bus bar 303 to the bus bar 305 through the shunt resistor 307 is detected using the pair of detection terminals 309 and 311.

However, in the shunt resistor device 301 according to comparative example, the detection terminals 309 and 311 are separately fixed on the bus bar, so the configuration is complicated, and when the fixing positions of the detection terminal 309 and 311 on the bus bars 303 and 305 are shifted, the accuracy of the detected current value or voltage value is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sensor, comprising:
   a first bus bar;
   a second bus bar; and
   a shunt resistor including a shunt resistor body part whose one end portion is bonded to the first bus bar and the other end portion is bonded to the second bus bar and a detection terminal extending from the shunt resistor body part,
   wherein the detection terminal of the shunt resistor is provided in at least one pair, and the at least one pair of detection terminals are separated from each other in a longitudinal direction which is a direction in which one end portion and the other end portion of the shunt resistor body part are connected to each other,
   wherein a value of a dimension in the longitudinal direction of a gap between the portion where the shunt resistor body part of the first bus bar is bonded and the portion where the shunt resistor body part of the second bus bar is bonded is smaller than a value of an outer dimension in the longitudinal direction of the pair of detection terminals, and the value of the dimension in the longitudinal direction of the gap between the portion where the shunt resistor body part of the first bus bar is bonded and the portion where the shunt resistor body part of the second bus bar is bonded is larger than the value of an inner dimension of the pair of detection terminals in the longitudinal direction, and
   wherein a ratio of the difference between the value of the dimension in the longitudinal direction of the gap between a portion where the shunt resistor body part of the first bus bar is bonded and a portion where the shunt resistor body part of the second bus bar is bonded and the value of the inner dimension in the longitudinal direction of the pair of detection terminals and the difference between the value of the outer dimension and the value of the inner dimension in the longitudinal direction of the pair of detection terminals is a ratio at which a value of a voltage generated between the pair of detection terminals is a peak value.

2. The sensor according to claim 1, further comprising:
   a circuit board,
   wherein the detection terminal is bonded to a detection terminal bonded portion of the circuit board.

3. The sensor according to claim 2, wherein the shunt resistor body part is bonded to the first bus bar and the second bus bar on a circuit board side.

4. The sensor according to claim 1, wherein the shunt resistor is bonded to each of the bus bars by using a fixing tool or by welding.

5. The sensor according to claim 1, wherein the ratio of the difference between the value of the dimension in the longitudinal direction of the gap between the portion where the shunt resistor body part of the first bus bar is bonded and the portion where the shunt resistor body part of the second bus bar is bonded and the value of the inner dimension of the pair of detection terminal in the longitudinal direction and a difference between the value of an outer dimension of the pair of detection terminal in the longitudinal direction and the value of the inner dimension is a ratio where an error in a measured value of a current flowing between the pair of bus bars is within a range of an allowable value, or is a ratio where an error in a measured value of a voltage between the pair of bus bars is within the range of an allowable value.

6. The sensor according to claim 1, wherein the shunt resistor body part and the detection terminal are made of the same member.

7. A shunt resistor, comprising:
   a shunt resistor body part formed in a plate shape;
   a first detection terminal extending from the shunt resistor body part; and
   a second detection terminal extending from the shunt resistor body part away from the first detection terminal,
   wherein the first detection terminal includes a first connecting part protruding from the shunt resistor body part and a first terminal body part extending from a tip of the first connecting part in a direction perpendicular to the first connecting part,
   the first terminal body part extends from the tip of the first connecting part to one side of the shunt resistor body part in a thickness direction, or the first terminal body part may be along a stretching direction of an edge of the shunt resistor body part and extend away from the second detection terminal from the tip of the first connecting part to a middle portion of the first terminal body part in a longer direction, and extends to one side of the shunt resistor body part in a thickness direction from the middle portion of the first terminal body part in the longer direction to the tip of the first terminal body part in the longer direction,
   the second detection terminal includes a second connecting part protruding from the shunt resistor body part and the second terminal body part extending from the tip of the second connecting part in a direction perpendicular to the second connecting part, and
   the second terminal body part extends from the tip of the second connecting part to one side of the shunt resistor body part in the thickness direction, or the second terminal body part is along the stretching direction of the edge of the shunt resistor body part and extends in a direction away from the first detection terminal from the tip of the second connecting part to the middle portion of the second terminal body part in the longer direction, and extends to one side of the shunt resistor body part in the thickness direction from the middle portion of the second terminal body part in the longer direction to the tip of the second terminal body part in the longer direction.

8. A sensor, comprising:

a first bus bar;

a second bus bar; and a shunt resistor including a shunt resistor body part whose one end portion is bonded to the first bus bar and the other end portion is bonded to the second bus bar and a detection terminal extending from the shunt resistor body part, wherein the detection terminal of the shunt resistor is provided in at least one pair, and the at least one pair of detection terminals are separated from each other in a longitudinal direction which is a direction in which one end portion and the other end portion of the shunt resistor body part are connected to each other, and wherein a value of a dimension in the longitudinal direction of a gap between a portion where the shunt resistor body part of the first bus bar is bonded and a portion where the shunt resistor body part of the second bus bar is bonded is 110% or more and 200% or less with respect to a value of an outer dimension of the pair of detection terminal in the longitudinal direction.

* * * * *